(12) United States Patent
Taniguchi

(10) Patent No.: US 9,184,782 B2
(45) Date of Patent: Nov. 10, 2015

(54) HIGH-FREQUENCY MODULE AND COMMUNICATION DEVICE

(71) Applicant: Murata Manufacturing Co., Ltd., Nagaokakyo-shi, Kyoto-fu (JP)

(72) Inventor: Yasumasa Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 450 days.

(21) Appl. No.: 13/761,940

(22) Filed: Feb. 7, 2013

(65) Prior Publication Data

US 2013/0147678 A1    Jun. 13, 2013

Related U.S. Application Data

(63) Continuation of application No. PCT/JP2011/062564, filed on Jun. 1, 2011.

(30) Foreign Application Priority Data

Aug. 11, 2010    (JP) .................................. 2010-180150

(51) Int. Cl.
*H04B 1/48*    (2006.01)
*H03H 9/72*    (2006.01)
(Continued)

(52) U.S. Cl.
CPC ................. *H04B 1/48* (2013.01); *H03H 9/706* (2013.01); *H03H 9/725* (2013.01); *H03H 9/74* (2013.01);
(Continued)

(58) Field of Classification Search
CPC ..... H01Q 1/50; H01Q 21/0006; H03H 9/725; H03H 9/74; H03H 9/76; H03H 9/0057; H03H 9/6483; H03H 9/706; H04B 1/48; H04B 1/50

USPC ............ 333/133, 187, 188, 193–196; 455/82, 455/83
See application file for complete search history.

(56) References Cited

U.S. PATENT DOCUMENTS 7,734,311 B2 *  6/2010  Satou ..................... H04B 1/406
                                                    455/114.1
2003/0076194 A1   4/2003  Machui
(Continued)

FOREIGN PATENT DOCUMENTS

JP         10-041704 A     2/1998
JP       2001-285123 A    10/2001
(Continued)

OTHER PUBLICATIONS

Official Communication issued in International Patent Application No. PCT/JP2011/062564, mailed on Jul. 26, 2011.

*Primary Examiner* — Benny Lee
*Assistant Examiner* — Jorge Salazar, Jr.
(74) *Attorney, Agent, or Firm* — Keating & Bennett, LLP

(57) ABSTRACT

A high-frequency module includes first and second demultiplexers and a band elimination filter. The first and second demultiplexers include common terminals, transmission filters, and reception filters, respectively. In the band elimination filter, a demultiplexer-side terminal is connected to the common terminal of the first demultiplexer. The band elimination filter includes a first pass band, and a second pass band and a stop band that are located adjacent to each other within the first pass band. The band elimination filter is configured so that the second pass band includes the pass band of each of the transmission filter and the reception filter in the first demultiplexer and the stop band includes the pass band of the transmission filter in the second demultiplexer.

20 Claims, 12 Drawing Sheets

(51) Int. Cl.
    *H03H 9/70*     (2006.01)
    *H03H 9/74*     (2006.01)
    *H03H 9/64*     (2006.01)
    *H04B 1/50*     (2006.01)
    *H01Q 1/50*     (2006.01)
    *H01Q 21/00*     (2006.01)
    *H03H 9/76*     (2006.01)
    *H03H 9/00*     (2006.01)

(52) U.S. Cl.
    CPC .............. *H01Q 1/50* (2013.01); *H01Q 21/0006* (2013.01); *H03H 9/0057* (2013.01); *H03H 9/6483* (2013.01); *H03H 9/76* (2013.01); *H04B 1/50* (2013.01)

(56) References Cited

U.S. PATENT DOCUMENTS

| | | |
|---|---|---|
| 2003/0143970 A1 | 7/2003 | Miyagawa et al. |
| 2005/0099244 A1 | 5/2005 | Nakamura et al. |
| 2008/0224799 A1 | 9/2008 | Taniguchi |
| 2009/0256649 A1 | 10/2009 | Taniguchi |
| 2010/0109801 A1 | 5/2010 | Inoue et al. |
| 2011/0095844 A1 | 4/2011 | Tanaka et al. |
| 2011/0227807 A1 | 9/2011 | Iwaki et al. |

FOREIGN PATENT DOCUMENTS

| | | |
|---|---|---|
| JP | 2003-517239 A | 5/2003 |
| JP | 2004-129238 A | 4/2004 |
| JP | 2005-020140 A | 1/2005 |
| JP | 2008-271187 A | 11/2008 |
| JP | 2010-062816 A | 3/2010 |
| JP | 2010-109894 A | 5/2010 |
| WO | 2007/023643 A1 | 3/2007 |
| WO | 2007/094139 A1 | 8/2007 |
| WO | 2008/072439 A1 | 6/2008 |
| WO | 2010/004686 A1 | 1/2010 |
| WO | 2010/061477 A1 | 6/2010 |

* cited by examiner

HIGH-FREQUENCY MODULE AND COMMUNICATION DEVICE

BACKGROUND OF THE INVENTION

1. Field of the Invention

The present invention relates to a high-frequency module and a communication device including such a high-frequency module. In particular, the present invention relates to a high-frequency module including a plurality of demultiplexers, and a communication device including such a high-frequency module.

2. Description of the Related Art

In recent years, in communication services involving cellular phones, for example, dealing with an increase in the number of subscribers, the realization of global roaming enabling use worldwide, the improvement of communication quality, the capacity enlargement of various kinds of contents have been promoted. So as to deal with such communication services, it is necessary to make communication devices such as mobile phones responsive to the realization of multiple bands or a plurality of communication systems.

Therefore, for example, in a communication device compatible with a plurality of bands in a UMTS (Universal Mobile Telecommunications System), a plurality of duplexers corresponding to individual bands and individual communication systems to be used are mounted in an RF (Radio Frequency) circuit. As an example of such a communication device, for example, a communication device described in Japanese National Publication of International Patent Application No. 2003-517239 may be cited and includes a high-frequency module including two duplexers. In addition, the duplexer is a demultiplexer including a transmission filter, a reception filter, and a matching circuit.

However, in the high-frequency module described in Japanese National Publication of International Patent Application No. 2003-517239, an Inter-Modulation Distortion (IMD) occurs in the duplexer, and in some cases, a problem that the receiving sensitivity of the communication device is deteriorated occurs.

SUMMARY OF THE INVENTION

Preferred embodiments of the present invention significantly reduce and prevent the occurrence of an IMD in a demultiplexer, in a high-frequency module including a plurality of demultiplexers.

A high-frequency module according to a preferred embodiment of the present invention includes first and second demultiplexers and a band elimination filter. Each of the first and second demultiplexers includes a common terminal, a transmission filter, and a reception filter. In each of the first and second demultiplexers, the transmission filter and the reception filter are connected to the common terminal. The band elimination filter includes an antenna-side terminal and a demultiplexer-side terminal. In the band elimination filter, the demultiplexer-side terminal is connected to the common terminal of the first demultiplexer. The band elimination filter includes a first pass band, and a second pass band and a stop band that are located adjacent to each other within the first pass band. The band elimination filter is configured so that the second pass band includes a pass band of each of the transmission filter and the reception filter in the first demultiplexer and the stop band includes a pass band of the transmission filter in the second demultiplexer.

In a specific aspect of the high-frequency module according to a preferred embodiment of the present invention, the band elimination filter is preferably configured so that the stop band roughly coincides with the pass band of the transmission filter in the second demultiplexer.

In another specific aspect of the high-frequency module according to a preferred embodiment of the present invention, the band elimination filter preferably is a filter including a plurality of resonators and an inductor.

In another specific aspect of the high-frequency module according to a preferred embodiment of the present invention, the band elimination filter preferably includes a series arm and a plurality of parallel arms. At least some resonators from among the plural resonators are provided as parallel arm resonators in the plural parallel arms. At least one of a resonator located in a first stage on the antenna-side terminal side of the band elimination filter and a resonator located in a first stage on the demultiplexer-side terminal side thereof is a parallel arm resonator.

In another specific aspect of the high-frequency module according to a preferred embodiment of the present invention, the band elimination filter preferably includes a series arm and a plurality of parallel arms. The plural resonators are connected to at least one of the series arm and the plural parallel arms. At least one of a resonator located in a first stage on the antenna-side terminal side of the band elimination filter and a resonator located in a first stage on the demultiplexer-side terminal side thereof is divided into a plurality of divided resonators and connected in series.

In another specific aspect of the high-frequency module according to a preferred embodiment of the present invention, the band elimination filter preferably includes a one-port type surface acoustic wave resonator.

A communication device according to another preferred embodiment of the present invention includes a high-frequency module according to one of the above-described preferred embodiments of the present invention.

In various preferred embodiments of the present invention, the band elimination filter is preferably configured so that the second pass band includes the pass band of each of the transmission filter and the reception filter in the first demultiplexer and the stop band includes the pass band of the transmission filter in the second demultiplexer. Therefore, it is possible to effectively reduce and prevent the occurrence of an Inter-Modulation Distortion (IMD) in a first duplexer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, one example of a preferred embodiment where the present invention is implemented will be described with citing a communication device 1 illustrated in FIG. 1 as a non-limiting example. In this regard, however, the communication device 1 is just an exemplification. The present invention is not limited to the communication device 1.

First Preferred Embodiment

Figure 1:
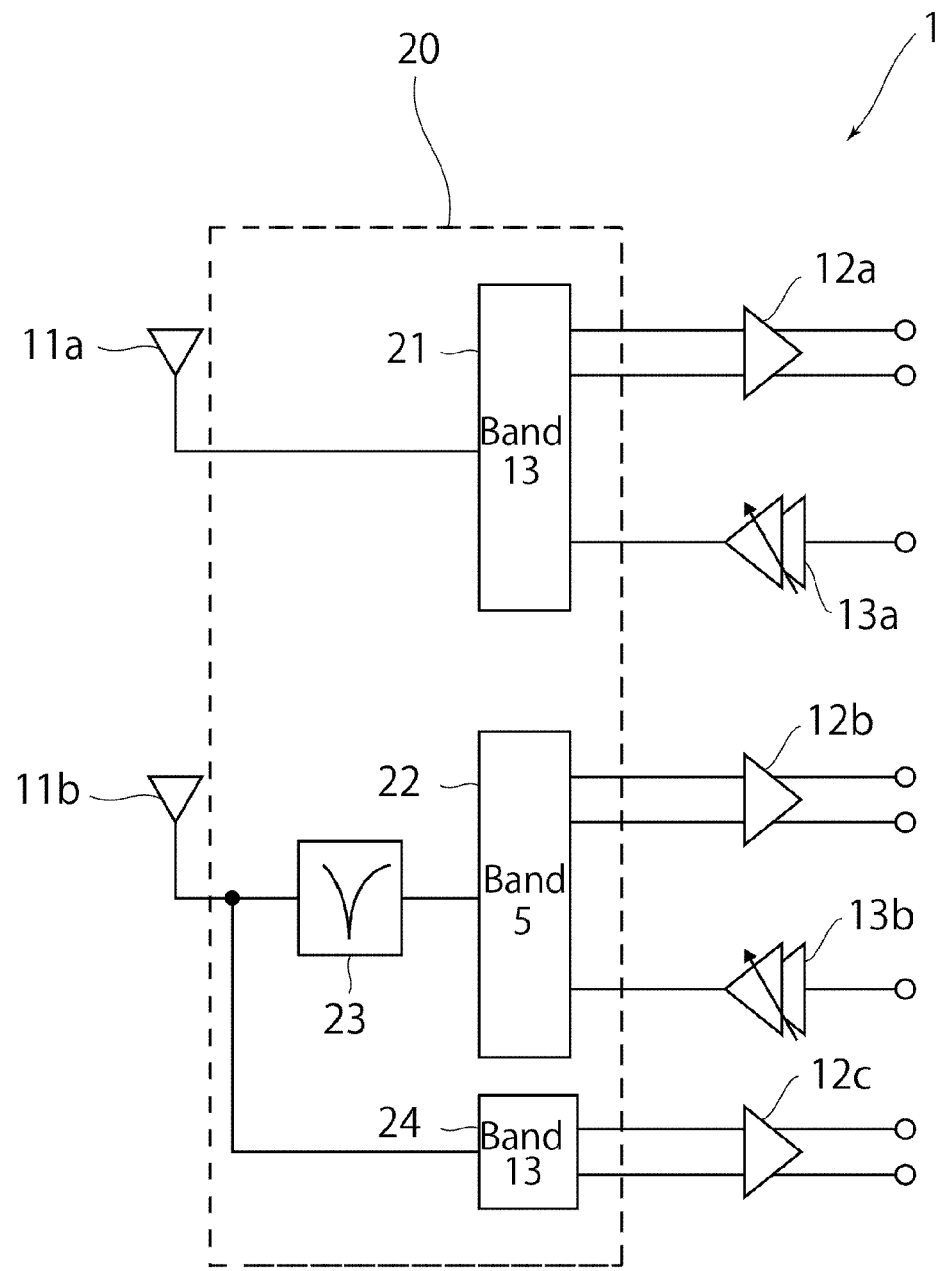
FIG. 1 is a schematic circuit diagram of a communication device according to a first preferred embodiment of the present invention.

FIG. 1 is the schematic circuit diagram of the communication device 1 according to a first preferred embodiment of the present invention.

The communication device 1 illustrated in FIG. 1 is a communication device compatible with communication services (simultaneous voice and data services) where audio communication and data communication are simultaneously performed. In the communication services with which the communication device 1 is compatible, a UMTS-BAND5 is preferably used for the audio communication, for example. A UMTS-BAND13 preferably is used for the data communication, for example.

As illustrated in FIG. 1, the communication device 1 includes a high-frequency module 20. First and second antennae 11a and 11b, low noise amplifiers 12a, 12b, and 12c, transmitting power amplifiers 13a and 13b are connected to the high-frequency module 20.

The high-frequency module 20 includes first and second duplexers 22 and 21 serving as demultiplexers, a band elimination filter 23, and a band pass filter 24. The second duplexer 21 is connected between the first antenna 11a and both of the low noise amplifier 12a and the transmitting power amplifier 13a.

The band elimination filter 23 is connected between the second antenna 11b and the first duplexer 22. The first duplexer 22 is connected between the band elimination filter 23 and both of the low noise amplifier 12b and the transmitting power amplifier 13b.

The band pass filter 24 is connected between the second antenna 11b and the low noise amplifier 12c.

Figure 2:
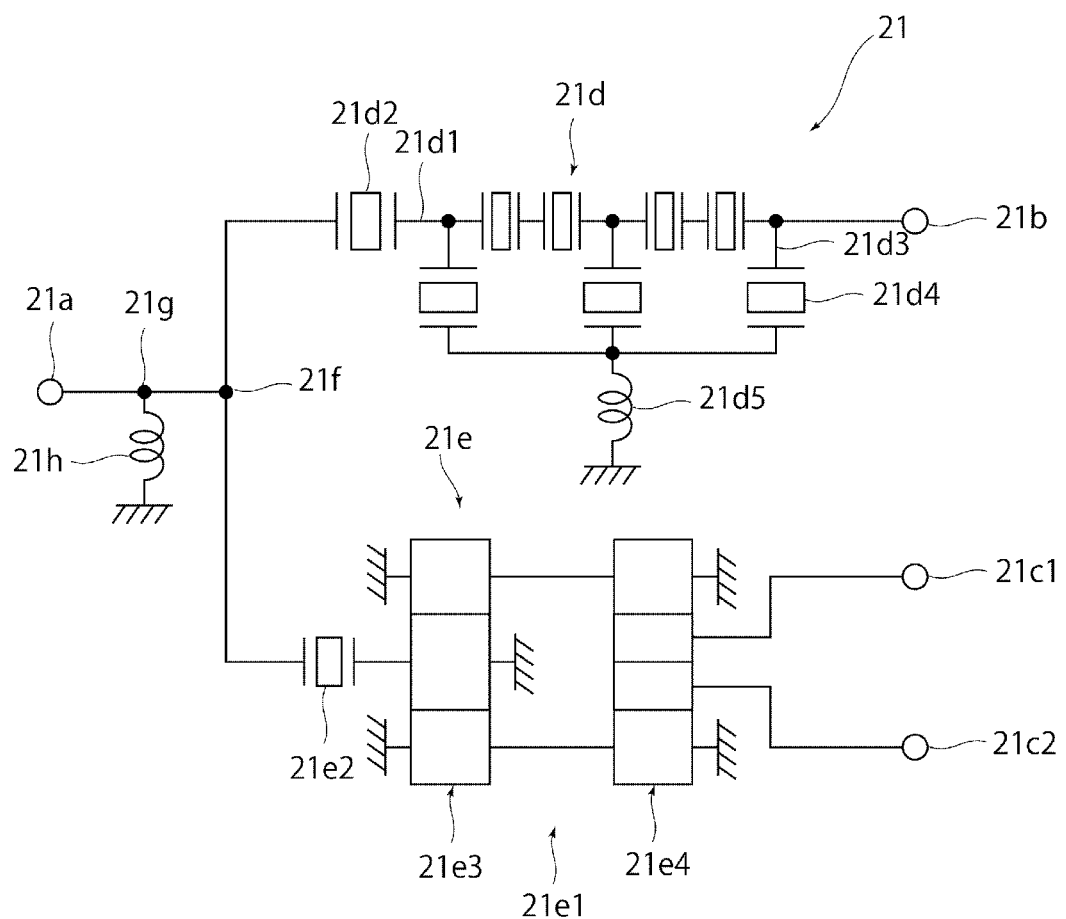
FIG. 2 is a schematic circuit diagram of a second duplexer in the first preferred embodiment of the present invention.

FIG. 2 is the schematic circuit diagram of the second duplexer 21 in the present preferred embodiment. The second duplexer 21 includes a common terminal 21a, a transmission terminal 21b, and first and second reception terminals 21c1 and 21c2. In addition, the second duplexer 21 includes a transmission filter 21d, a reception filter 21e, and a matching circuit 21h. The common terminal 21a is connected to the first antenna 11a illustrated in FIG. 1. The transmission terminal 21b is connected to the transmitting power amplifier 13a. The first and second reception terminals 21c1 and 21c2 are connected to the low noise amplifier 12a. The transmission filter 21d and the reception filter 21e are connected to each other at a connection point 21f.

The transmission filter 21d is connected between the common terminal 21a and the transmission terminal 21b. The transmission filter 21d is a ladder type surface acoustic wave filter. The transmission filter 21d includes a plurality of series arm resonators 21d2 connected in series in a series arm 21d1, parallel arm resonators 21d4 individually provided in a plurality of parallel arms 21d3 establishing connection between the series arm 21d1 and a ground potential, and an inductor 21d5 connected between the parallel arm resonators 21d4 and the ground potential. The series arm resonator 21d2 and the parallel arm resonator 21d4 are preferably defined by one-port type surface acoustic wave resonators, for example. In addition, the transmission filter 21d may also be a ladder type elastic wave filter preferably defined by one-port type elastic wave resonators such as one-port type boundary acoustic wave resonators or one-port type piezoelectric thin film resonators, for example.

The reception filter 21e is connected between the common terminal 21a and the first and second reception terminals 21c1 and 21c2. The reception filter 21e is a balanced longitudinally coupled resonator-type elastic wave filter having a balanced-unbalanced transforming function. Specifically, in the present preferred embodiment, the reception filter 21e is a balanced longitudinally coupled resonator-type surface acoustic wave filter having the balanced-unbalanced transforming function. The reception filter 21e includes a longitudinally coupled resonator-type surface acoustic wave filter portion 21e1 and a one-port type surface acoustic wave resonator 21e2. The one-port type surface acoustic wave resonator 21e2 is connected between the common terminal 21a and the longitudinally coupled resonator-type surface acoustic wave filter portion 21e1. In the longitudinally coupled resonator-type surface acoustic wave filter portion 21e1, a so-called three-IDT type longitudinally coupled resonator-type surface acoustic wave filter portions 21e3 and 21e4 are cascade-connected.

The connection point 21*f* and the common terminal 21*a* are connected to each other at a connection point 21*g*. The matching circuit 21*h* including an inductor is connected between the connection point 21*g* and the ground potential.

The second duplexer 21 illustrated in FIG. 2 is a demultiplexer compatible with a UMTS-BAND13, for example. In the UMTS-BAND13, a transmitting side pass band is from 777 MHz to 787 MHz, and a receiving side pass band is from 746 MHz to 756 MHz. Accordingly, the pass band of the transmission filter 21*d* is from 777 MHz to 787 MHz, and the pass band of the reception filter 21*e* is from 746 MHz to 756 MHz.

Figure 3:
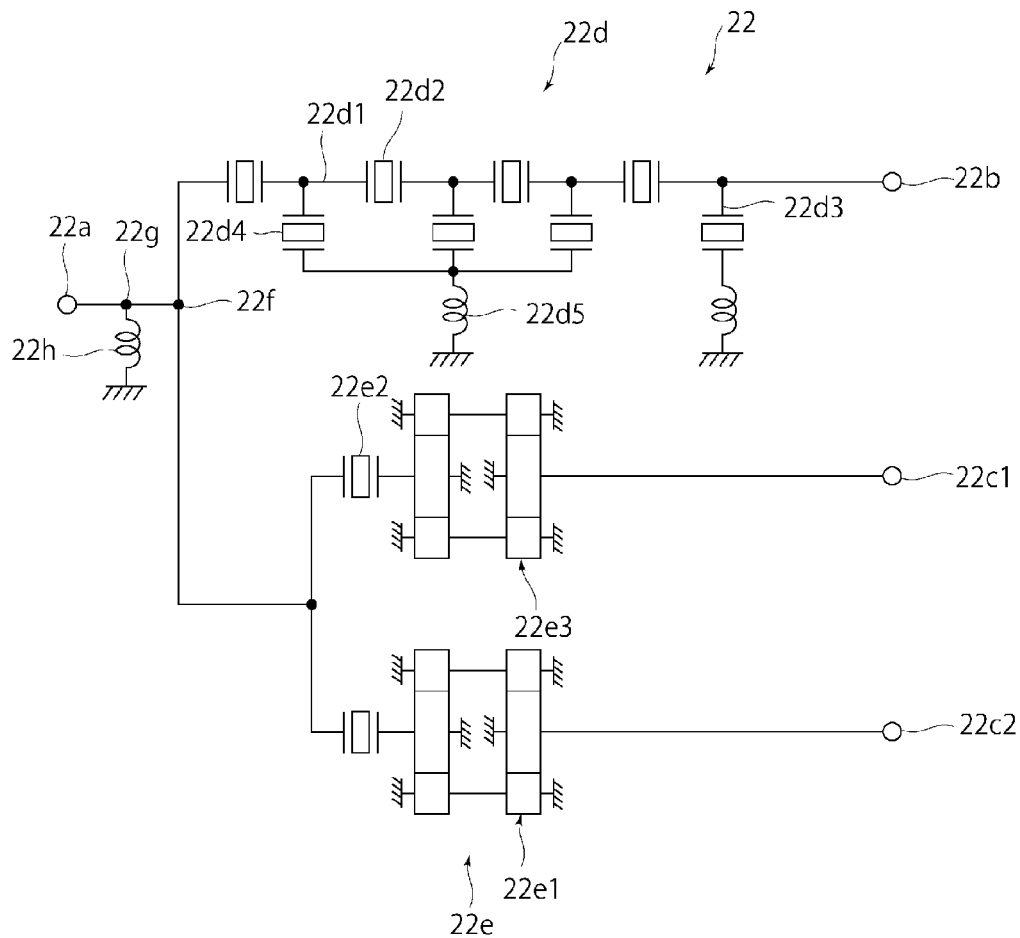
FIG. 3 is a schematic circuit diagram of a first duplexer in the first preferred embodiment of the present invention.

FIG. 3 is the schematic circuit diagram of the first duplexer 22 in the present preferred embodiment. The first duplexer 22 includes a common terminal 22*a*, a transmission terminal 22*b*, and first and second reception terminals 22*c*1 and 22*c*2. In addition, the first duplexer 22 includes a transmission filter 22*d*, a reception filter 22*e*, and a matching circuit 22*h*. The common terminal 22*a* is connected to the second antenna 11*b* through the band elimination filter 23 illustrated in FIG. 1. The transmission terminal 22*b* is connected to the transmitting power amplifier 13*b*. The first and second reception terminals 22*c*1 and 22*c*2 are connected to the low noise amplifier 12*b*. The transmission filter 22*d* and the reception filter 22*e* are connected to each other at a connection point 22*f*.

The transmission filter 22*d* is connected between the common terminal 22*a* and the transmission terminal 22*b*. The transmission filter 22*d* is a ladder type surface acoustic wave filter. The transmission filter 22*d* includes a plurality of series arm resonators 22*d*2 connected in series in a series arm 22*d*1, parallel arm resonators 22*d*4 individually provided in a plurality of parallel arms 22*d*3 establishing connection between the series arm 22*d*1 and a ground potential, and an inductor 22*d*5 connected between the parallel arm resonators 22*d*4 and the ground potential. The series arm resonator 22*d*2 and the parallel arm resonator 22*d*4 preferably include one-port type surface acoustic wave resonators. In addition, the transmission filter 22*d* may also be a ladder type elastic wave filter preferably including one-port type elastic wave resonators such as one-port type boundary acoustic wave resonators or one-port type piezoelectric thin film resonators.

The reception filter 22*e* is connected between the common terminal 22*a* and the first and second reception terminals 22*c*1 and 22*c*2. The reception filter 22*e* is a balanced longitudinally coupled resonator-type elastic wave filter having a balanced-unbalanced transforming function. Specifically, in the present preferred embodiment, the reception filter 22*e* is a balanced longitudinally coupled resonator-type surface acoustic wave filter having the balanced-unbalanced transforming function. The reception filter 22*e* includes a longitudinally coupled resonator-type surface acoustic wave filter portion 22*e*1 and two one-port type surface acoustic wave resonators 22*e*2. The one-port type surface acoustic wave resonators 22*e*2 are connected between the common terminal 22*a* and the longitudinally coupled resonator-type surface acoustic wave filter portion 22*e*1. The longitudinally coupled resonator-type surface acoustic wave filter portion 22*e*1 includes four three-IDT type longitudinally coupled resonator-type surface acoustic wave filter portions 22*e*3.

The connection point 22*f* and the common terminal 22*a* are connected to each other at a connection point 22*g*. The matching circuit 22*h* including an inductor is connected between the connection point 22*g* and the ground potential.

The first duplexer 22 illustrated in FIG. 3 is a demultiplexer compatible with the UMTS-BAND5, for example. The transmitting side pass band of the UMTS-BAND5 is from 824 MHz to 849 MHz, and the receiving side pass band thereof is from 869 MHz to 894 MHz. Accordingly, the pass band of the transmission filter 22*d* is from 824 MHz to 849 MHz, and the pass band of the reception filter 22*e* is from 869 MHz to 894 MHz.

Figure 4:
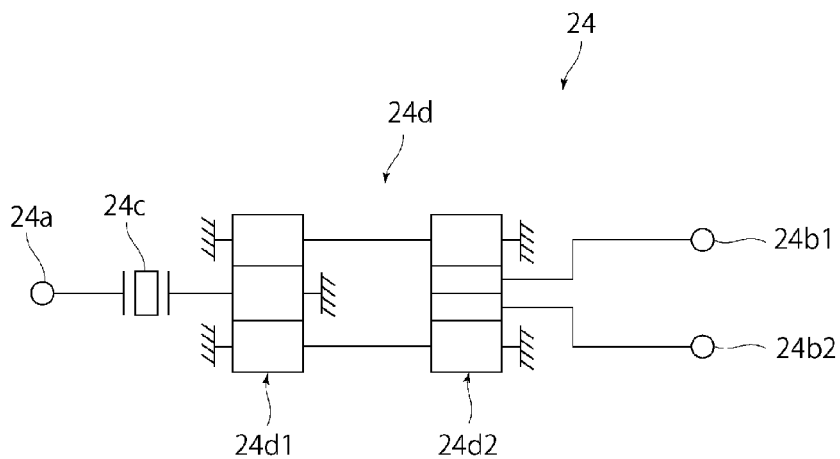
FIG. 4 is a schematic circuit diagram of a band pass filter in the first preferred embodiment of the present invention.

FIG. 4 is the schematic circuit diagram of the band pass filter 24 in the present preferred embodiment. The band pass filter 24 illustrated in FIG. 4 is a reception filter compatible with the UMTS-BAND13, for example. The receiving side pass band of the UMTS-BAND13 is from 746 MHz to 756 MHz. Accordingly, the pass band of the band pass filter 24 is from 746 MHz to 756 MHz.

The band pass filter 24 includes an input terminal 24*a* and first and second output terminals 24*b*1 and 24*b*2. The input terminal 24*a* is connected to the second antenna 11*b* illustrated in FIG. 1. The first and second output terminals 24*b*1 and 24*b*2 are connected to the low noise amplifier 12*c*.

The band pass filter 24 is a balanced longitudinally coupled resonator-type elastic wave filter having a balanced-unbalanced transforming function. Specifically, in the present preferred embodiment, the band pass filter 24 is a balanced longitudinally coupled resonator-type surface acoustic wave filter having the balanced-unbalanced transforming function. The band pass filter 24 includes a one-port type surface acoustic wave resonator 24*c* and a longitudinally coupled resonator-type surface acoustic wave filter portion 24*d*. The one-port type surface acoustic wave resonator 24*c* is connected between the input terminal 24*a* and the longitudinally coupled resonator-type surface acoustic wave filter portion 24*d*. The longitudinally coupled resonator-type surface acoustic wave filter portion 24*d* includes two three-IDT type longitudinally coupled resonator-type surface acoustic wave filter portions 24*d*1 and 24*d*2 cascade-connected.

Figure 5:
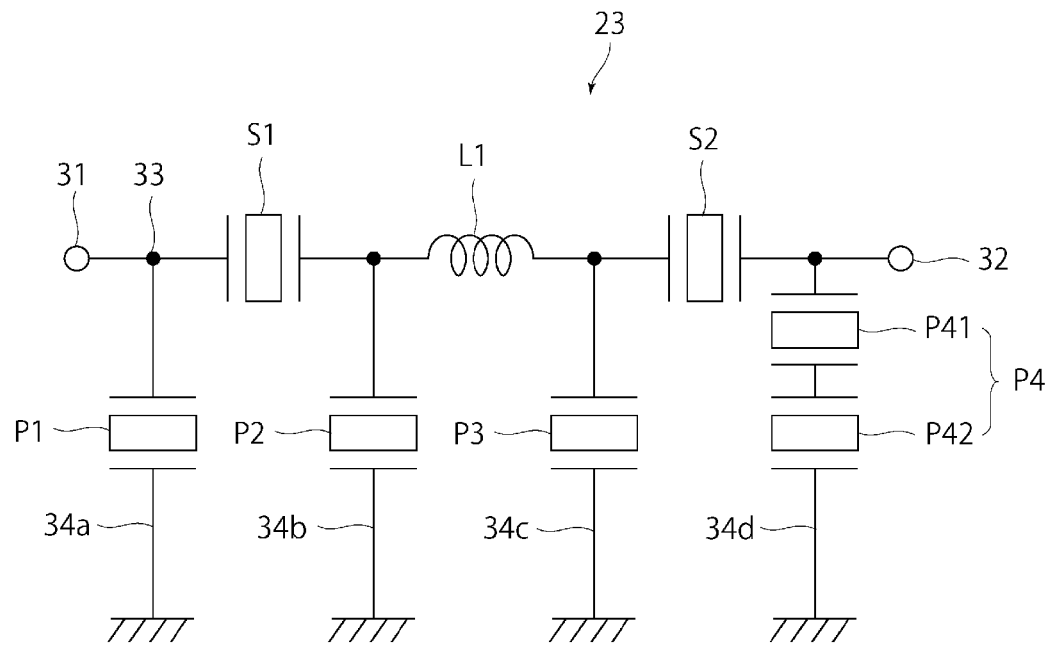
FIG. 5 is a schematic circuit diagram of a band elimination filter in the first preferred embodiment of the present invention.

FIG. 5 is the schematic circuit diagram of the band elimination filter 23 in the present preferred embodiment. As illustrated in FIG. 5, the band elimination filter 23 is a filter including an inductor and a plurality of resonators. Specifically, the band elimination filter 23 is an elastic wave filter including an inductor and a plurality of elastic wave resonators.

In detail, the band elimination filter 23 includes an antenna-side terminal 31 and a demultiplexer-side terminal 32. The antenna-side terminal 31 is connected to the second antenna 11*b* illustrated in FIG. 1. On the other hand, the demultiplexer-side terminal 32 is connected to the first duplexer 22. In other words, the demultiplexer-side terminal 32 is connected to the common terminal 22*a* of the first duplexer 22.

The antenna-side terminal 31 and the demultiplexer-side terminal 32 are connected to each other via a series arm 33. In the series arm 33, a plurality of series arm resonators S1 and S2 and an inductor L1 are provided. These plural series arm resonators S1 and S2 and the inductor L1 are connected in series in the series arm 33. The series arm 33 and the ground potential are connected to each other through a plurality of parallel arms 34*a* to 34*d*. In the plural parallel arms 34*a* to 34*d*, parallel arm resonators P1 to P4 are provided, respectively.

In the present preferred embodiment, at least one of a resonator located in a first stage on the antenna-side terminal 31 side of the band elimination filter 23 and a resonator located in a first stage on the demultiplexer-side terminal 32 side thereof is a parallel arm resonator. In other words, at least one of a resonator nearest to the antenna-side terminal 31 of the band elimination filter 23 and a resonator nearest to the demultiplexer-side terminal 32 thereof is a parallel arm resonator. Specifically, in the present preferred embodiment, the resonator located in the first stage on the antenna-side terminal 31 side of the band elimination filter 23 is the parallel arm resonator P1, and the resonator located in the first stage on the demultiplexer-side terminal 32 side thereof is the parallel arm resonator P4. In other words, in the series arm 33, no series arm resonator is provided between a connection point with the parallel arm 34a where the parallel arm resonator P1 is provided and the antenna-side terminal 31 or between a connection point with the parallel arm 34d where the parallel arm resonator P4 is provided and the demultiplexer-side terminal 32.

In addition, at least one of the above-mentioned parallel arm resonators P1 and P4 is divided into a plurality of divided resonators functioning as one parallel arm resonator. Specifically, in the present preferred embodiment, the parallel arm resonator P4 is divided into divided resonators P41 and P42. Specifically, the plural divided resonators are connected in series, and hence, the parallel arm resonator P4 is provided. In doing this way, it is possible to significantly reduce and prevent the occurrence of the Inter-Modulation Distortion (IMD) in the band elimination filter 23 and it is also possible to improve power durability.

In addition, in the present preferred embodiment, each of the series arm resonators S1 and S2 and the parallel arm resonators P1 to P4 preferably includes a one-port type elastic wave resonator. Specifically, each of the series arm resonators S1 and S2 and the parallel arm resonators P1 to P4 preferably includes a one-port type surface acoustic wave resonator. The parallel arm resonator P4 may also be configured by connecting in series a plurality of one-port type surface acoustic wave resonators.

Figure 6:
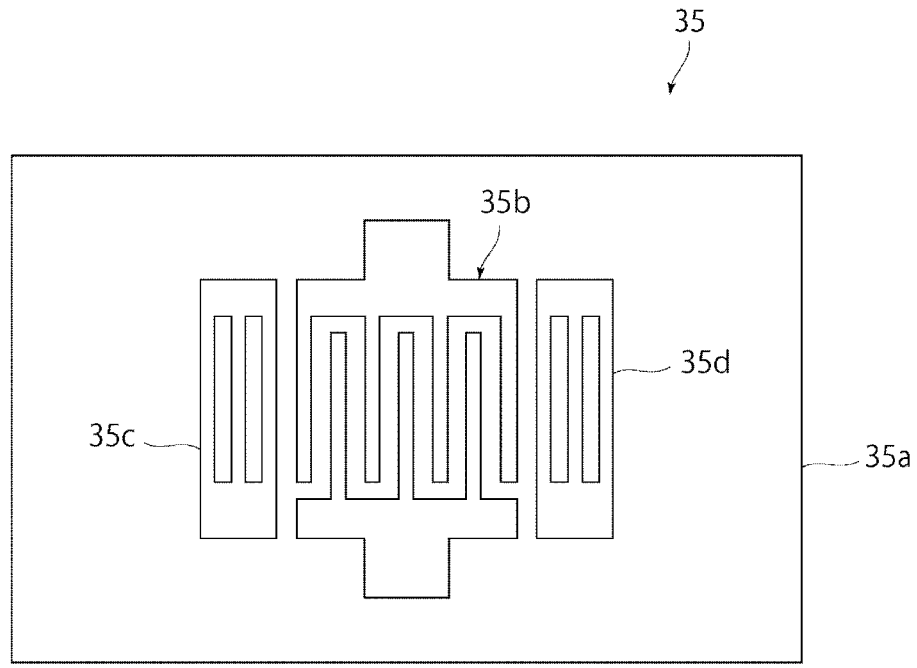
FIG. 6 is a schematic plan view of a one-port type surface acoustic wave resonator configuring a series arm resonator and a parallel arm resonator in the band elimination filter in the first preferred embodiment of the present invention.

FIG. 6 illustrates the schematic plan view of a one-port type surface acoustic wave resonator 35 defining the series arm resonators S1 and S2 and the parallel arm resonators P1 to P4. As illustrated in FIG. 6, the one-port type surface acoustic wave resonator 35 includes a piezoelectric substrate 35a. On the piezoelectric substrate 35a, an IDT electrode 35b is located and includes a pair of comb-tooth-shaped electrodes interleaved with each other. On the surface of the piezoelectric substrate 35a, a pair of reflectors 35c and 35d is located on both sides in the surface acoustic wave propagation direction of the IDT electrode 35b. In addition, in the present preferred embodiment, the individual piezoelectric substrates 35a of the series arm resonators S1 and S2 and the parallel arm resonators P1 to P4 preferably are integrally formed. The inductor L1 preferably is a chip-type inductor.

In the following Table 1, the design parameters of the series arm resonators S1 and S2 and the parallel arm resonators P1 to P4 in the present preferred embodiment are illustrated. In addition, since the divided resonators P41 and P42 function as one parallel arm resonator P4, same design parameters are adopted in the divided resonators P41 and P42. In addition, the inductance value of the inductor L1 preferably is about 9.5 nH, for example.

Figure 7:
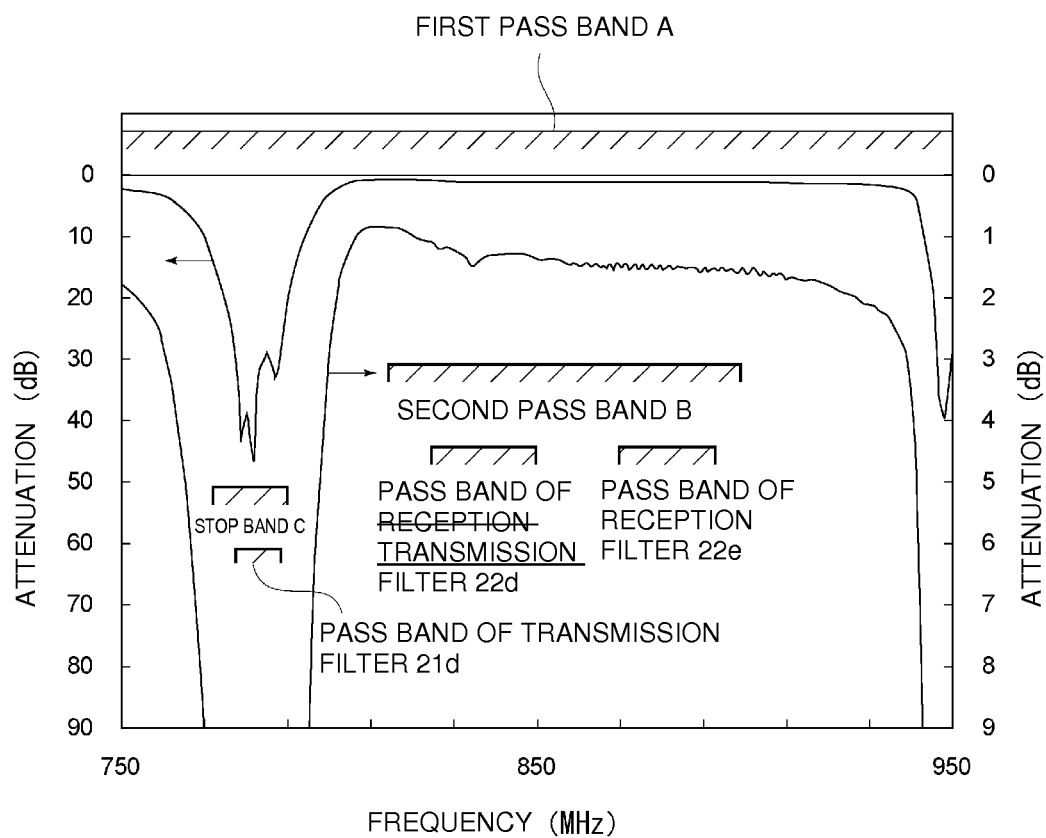
FIG. 7 is a graph illustrating a frequency characteristic of the band elimination filter in the first preferred embodiment of the present invention.

FIG. 7 is a graph illustrating the frequency characteristic of the band elimination filter 23 in the present preferred embodiment. As illustrated in FIG. 7, the band elimination filter 23 includes a first pass band A, a second pass band B, and a stop band C. The second pass band B and the stop band C are located adjacent to each other within the first pass band A.

In the following Table 2, the first and second pass bands A and B and the stop band C of the band elimination filter 23, the pass bands of the transmission filter 22d and the reception filter 22e in the first duplexer 22, the pass bands of the transmission filter 21d and the reception filter 21e in the second duplexer 21, and the pass band of the band pass filter 24 are collected.

TABLE 2

| | | BAND (MHz) |
|---|---|---|
| SECOND | RECEPTION FILTER 21e | 746-756 |
| DUPLEXER 21 | TRANSMISSION FILTER 21d | 777-787 |
| FIRST | RECEPTION FILTER 22e | 869-894 |
| DUPLEXER 22 | TRANSMISSION FILTER 22d | 824-849 |
| BAND PASS FILTER 24 | | 746-756 |
| FIRST PASS BAND A | | 640-1000 |
| SECOND PASS BAND B | | 815-900 |
| STOP BAND C | | 774-790 |

The first pass band A is formed by an LC resonance circuit due to the inductance of the inductor L1, the capacitance of the series arm resonators S1 and S2, and the capacitance of the parallel arm resonators P1 to P4. In addition, in the present preferred embodiment, the first pass band A is defined as a band whose attenuation is less than or equal to about 5 dB, for example, in a frequency other than the stop band C and the vicinity thereof.

The second pass band B is allocated within the first pass band A, and adjacent to the stop band C. The second pass band B includes both of the pass band (824 MHz to 849 MHz) of the transmission filter 22d and the pass band (869 MHz to 894 MHz) of the reception filter 22e in the first duplexer 22 connected to the band elimination filter 23.

The stop band C is allocated within the first pass band A, and adjacent to the second pass band B. The stop band C is formed by resonance of the parallel arm resonators P1 to P4. The stop band C includes the pass band (777 MHz to 787 MHz) of the transmission filter 21d in the second duplexer 21. In the present preferred embodiment, specifically, the stop band C roughly coincides with the pass band (777 MHz to 787 MHz) of the transmission filter 21d in the second duplexer 21.

Figure 8:
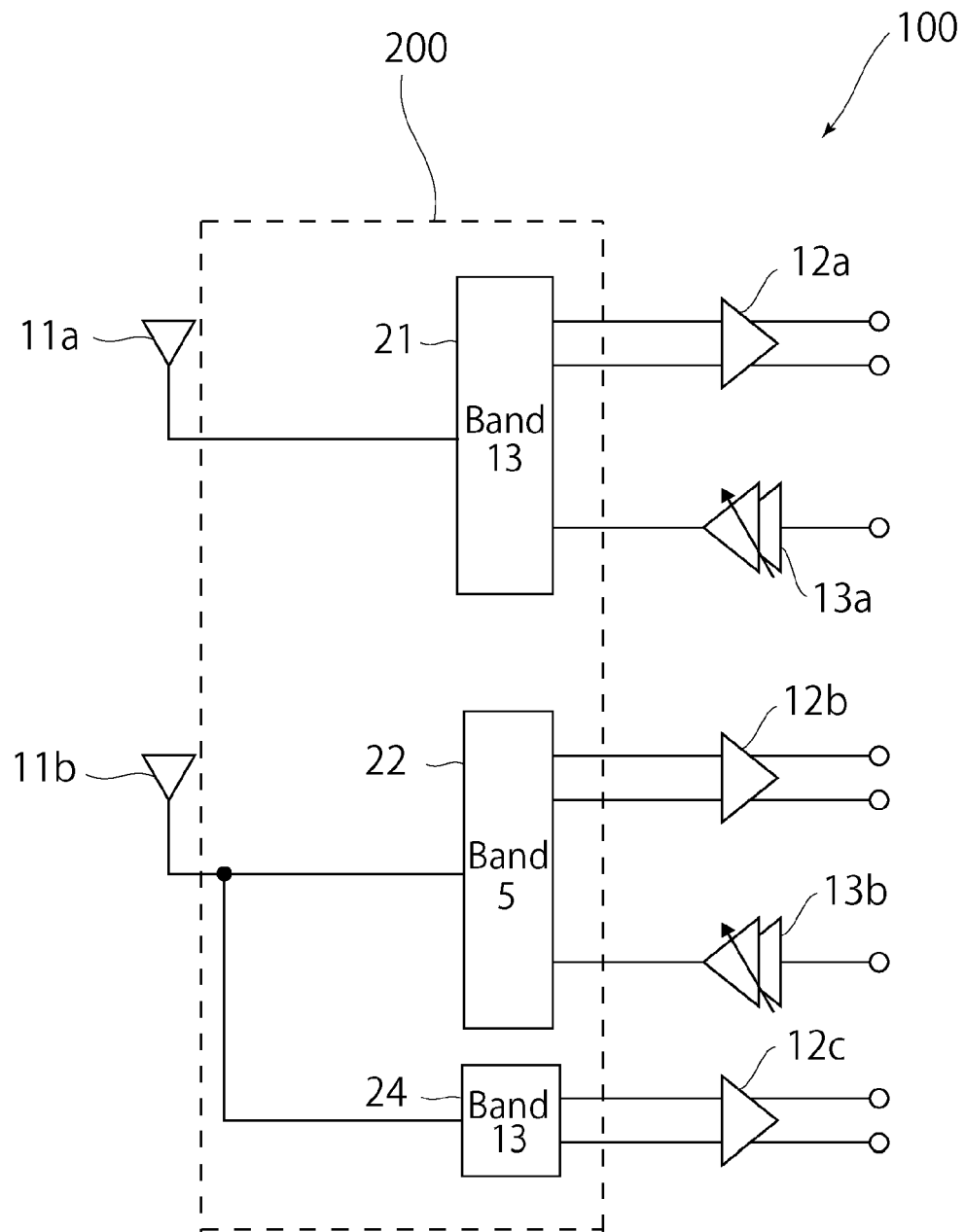
FIG. 8 is a schematic circuit diagram of a communication device according to a comparative example in which a band elimination filter is excluded.

FIG. 8 illustrates the schematic circuit diagram of a communication device 100 according to a comparative example. The communication device 100 shares a configuration substantially in common with the communication device 1 of the first preferred embodiment except for including a high-frequency module 200 including no band elimination filter 23. In other words, the high-frequency module 200 shares a configuration substantially in common with the high-frequency module 20 of the first preferred embodiment except for including no band elimination filter 23. Therefore, here, a member having a function substantially in common with the

TABLE 1

| | P1 | S1 | P2 | P3 | S2 | P41 | P42 |
|---|---|---|---|---|---|---|---|
| WAVELENGTH (μm) | 4.9725 | 4.2108 | 5.0079 | 4.9647 | 4.2167 | 5.0353 | 5.0353 |
| APODIZATION (μm) | 49.1 | 130.0 | 50.4 | 45.5 | 87.7 | 49.8 | 49.8 |
| NUMBER OF PAIRS (PAIR) | 44 | 100 | 77 | 73 | 100 | 82 | 82 |
| DUTY RATIO | 0.69 | 0.75 | 0.69 | 0.69 | 0.75 | 0.69 | 0.69 |
| RESONANCE POINT (MHz) | 788 | 919 | 782 | 789 | 918 | 779 | 779 |
| ANTIRESONANCE POINT (MHz) | 814 | 949 | 809 | 815 | 948 | 805 | 805 | first preferred embodiment will be taken into consideration with a common symbol, and the description thereof will be omitted.

In the communication device 100 according to the comparative example, when audio communication and data communication are simultaneously performed, the following problem occurs. In the communication device 100, when the transmission of the audio communication and the transmission of the data communication are simultaneously performed, the transmission signal of the data communication of the UMTS-BAND13 is output from the second duplexer 21, and the transmission signal of the audio communication of the UMTS-BAND5 is output from the first duplexer 22. At this time, a portion of the transmission signal of the data communication of the UMTS-BAND13 flows, as an interfering wave, into the reception filter 22e in the first duplexer 22 through the first antenna 11a and the second antenna 11b. On the other hand, a portion of the transmission signal of the audio communication of the UMTS-BAND5 leaks, and flows into the reception filter 22e in the first duplexer 22. Here, the transmission signal of the data communication of the UMTS-BAND13, which has flowed as an interfering wave, and the transmission signal of the audio communication of the UMTS-BAND5, which has leaked, cause intermodulation, and a distortion component occurs within the pass band of the reception filter 22e in the first duplexer 22. In other words, the Inter-Modulation Distortion (IMD) occurs.

For example, when the transmission signal of the data communication of the UMTS-BAND13 is 782 MHz and the transmission signal of the audio communication of the UMTS-BAND5 is 827 MHz, the Inter-Modulation Distortion (IMD) of 872 MHz that is within the receiving side pass band of the UMTS-BAND5 occurs. This Inter-Modulation Distortion (IMD) passes through the reception filter 22e in the first duplexer 22, and turns out to flow into a receiving circuit. As a result, the receiving sensitivity of the communication device 100 is deteriorated.

On the other hand, in the communication device 1 according to the first preferred embodiment, the high-frequency module 20 that includes the band elimination filter 23 is provided. Specifically, the band elimination filter 23 is connected between the second antenna 11b and the first duplexer 22.

The band elimination filter 23 has the second pass band B. In addition, the second pass band B includes the pass band (824 MHz to 849 MHz) of the transmission filter 22d and the pass band (869 MHz to 894 MHz) of the reception filter 22e in the first duplexer 22 connected to the band elimination filter 23. Therefore, the band elimination filter 23 causes the signal of the pass band of the reception filter 22e in the first duplexer 22 to pass therethrough, from among signals input to the antenna-side terminal 31, and causes the signal of the pass band of the transmission filter 22d in the first duplexer 22 to pass therethrough, from among signals input to the demultiplexer-side terminal 32.

In addition, the band elimination filter 23 has the stop band C. In addition, the stop band C roughly coincides with the pass band (777 MHz to 787 MHz) of the transmission filter 21d in the second duplexer 21.

Therefore, the band elimination filter 23 attenuates the signal of the pass band of the transmission filter 21d in the second duplexer 21 and prevents the signal from passing therethrough, from among signals input to the antenna-side terminal 31.

In the communication device 1, when the transmission of the audio communication and the transmission of the data communication are simultaneously performed, the transmission signal of the data communication of the UMTS-BAND13 is output from the second duplexer 21, and the transmission signal of the audio communication of the UMTS-BAND5 is output from the first duplexer 22. At this time, the transmission signal of the data communication of the UMTS-BAND13, which has flowed through the first antenna 11a and the second antenna 11b, is attenuated by the band elimination filter 23. Accordingly, a portion of the transmission signal of the data communication of the UMTS-BAND13 hardly flows, as an interfering wave, into the reception filter 22e in the first duplexer 22. As a result, the occurrence of the Inter-Modulation Distortion (IMD) is effectively reduced and prevented. In this way, in the high-frequency module 20 of the first preferred embodiment, the band elimination filter 23 is connected between the second antenna 11b and the first duplexer 22, and the stop band C of the band elimination filter 23 includes the pass band (777 to 787 MHz) of the transmission filter 21d in the second duplexer 21. Therefore, the occurrence of the Inter-Modulation Distortion (IMD) in the first duplexer 22 is effectively reduced and prevented. Accordingly, it is possible to improve the receiving sensitivity of the communication device 1 in which the high-frequency module 20 is mounted.

When the band elimination filter 23 includes a one-port type surface acoustic wave resonator as in the high-frequency module 20 of the first preferred embodiment, the linearity of the one-port type surface acoustic wave resonator is low. Therefore, the Inter-Modulation Distortion (IMD) occurring in the band elimination filter 23 tends to become large. However, in the high-frequency module 20 of the first preferred embodiment, the parallel arm resonator P1 is used as a resonator nearest to the antenna-side terminal 31, in the band elimination filter 23. Therefore, the Inter-Modulation Distortion (IMD) occurring in the band elimination filter 23 does not become so large. This is because the stop band C of the band elimination filter 23 is formed by the resonance of the parallel arm resonator.

Reducing the impedance of a resonator located in a first stage on a terminal side into which a signal is input is effective for reducing and preventing the occurrence of the Inter-Modulation Distortion (IMD) in the band elimination filter 23. When, as in the band elimination filter 23, the parallel arm resonator P1 or P4 is used as a resonator located in a first stage on a terminal side into which a signal is input, namely, in the first stage on at least one of the antenna-side terminal side and the demultiplexer-side terminal 32 side, the stop band C is formed by the resonance of the parallel arm resonators P1 to P4. Therefore, it is possible to reduce the impedance of the parallel arm resonators P1 and P4 serving as resonators located in the first stages on the antenna-side terminal 31 side and the demultiplexer-side terminal 32 side, in a frequency in the vicinity of an input signal. Accordingly, it is possible to significantly reduce and prevent the occurrence of the Inter-Modulation Distortion (IMD) in the band elimination filter 23.

In addition, in the high-frequency module 20 of the first preferred embodiment, the series arm resonators S1 and S2 of the band elimination filter 23 mainly function as capacitors. Accordingly, it is possible to reduce the insertion loss of the second pass band B. Accordingly, in the band elimination filter 23, capacitors including comb-tooth-shaped electrodes, chip-type capacitors, or the like may be used in place of the series arm resonators S1 and S2, for example.

Hereinafter, another example of a preferred embodiment where the present invention is implemented and an example of a modification thereto will be described. In addition, in the following description, a member having a function substantially in common with the above-described first preferred embodiment will be taken into consideration with a common symbol, and the description thereof will be omitted.

First Example of Modification

Figure 9:
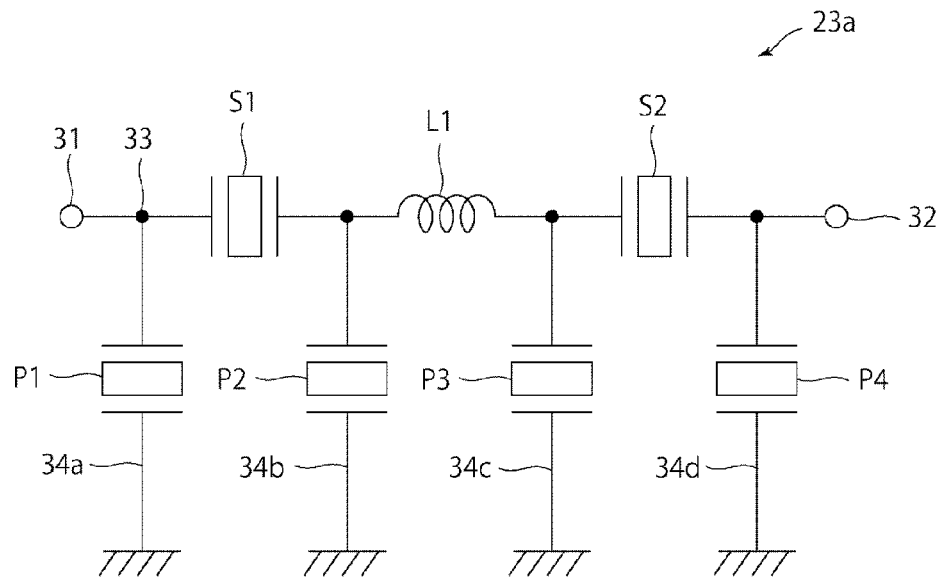
FIG. 9 is a schematic circuit diagram of a band elimination filter in a first example of a modification to the first preferred embodiment of the present invention.

FIG. 9 is the schematic circuit diagram of a band elimination filter 23a in a first example of a modification to the first preferred embodiment. As illustrated in FIG. 9, the parallel arm resonator P4 may not be divided into a plurality of divided resonators. In other words, a parallel arm resonator serving as a resonator located in the first stage on the demultiplexer-side terminal 32 side may not be divided into a plurality of divided resonators. In addition, the impedance of the parallel arm resonator P4 in the present example of a modification is caused to be equal or substantially equal to the combined impedance of the divided resonators P41 and P42 in the above-mentioned first preferred embodiment.

Here, the divided resonators P41 and P42 in the first preferred embodiment are compared with the parallel arm resonator P4 in the present example of a modification. So as to cause the impedance of the parallel arm resonator P4 in the present example of a modification and the combined impedance of the divided resonators P41 and P42 connected in series in the first preferred embodiment to be equal or substantially equal to each other, it is necessary to cause the number of pairs or the apodization of each of the divided resonators P41 and P42 to be twice as large as the number of pairs or the apodization of the parallel arm resonator P4 in the present example of a modification. Therefore, the electrode area of the divided resonators P41 and P42 becomes larger than the electrode area of the parallel arm resonator P4 in the present example of a modification. Accordingly, the electric power consumption of the band elimination filter in the first preferred embodiment becomes smaller than in the first example of a modification. Accordingly, it is possible for the first preferred embodiment to more effectively reduce and prevent the occurrence of the Inter-Modulation Distortion (IMD) in the band elimination filter. However, in view of downsizing, the first example of a modification is more desirable.

Second Example of Modification

Figure 10:
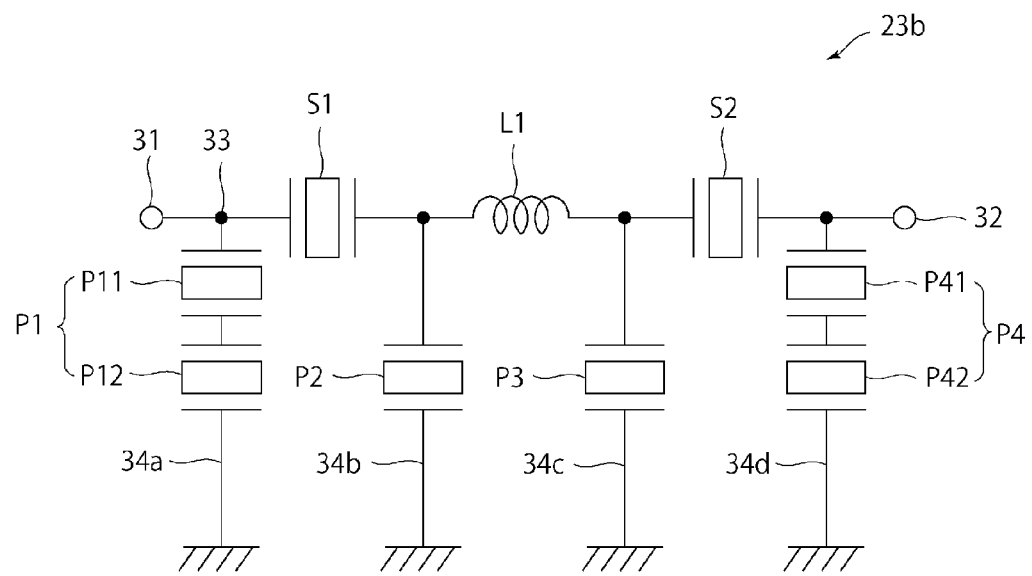
FIG. 10 is a schematic circuit diagram of a band elimination filter in a second example of a modification to the first preferred embodiment of the present invention.

FIG. 10 is the schematic circuit diagram of a band elimination filter 23b in a second example of a modification to the first preferred embodiment. The band elimination filter 23b illustrated in FIG. 10 is different from the band elimination filter 23 in the above-mentioned first preferred embodiment in that the parallel arm resonator P1 is divided into a plurality of divided resonators P11 and P12 functioning as one parallel arm resonator. In addition, in the present preferred embodiment, the combined impedance of the divided resonators P11 and P12 is caused to be equal or substantially equal to the impedance of the parallel arm resonator P1 in the first preferred embodiment.

When, as in the present preferred embodiment, each of a parallel arm resonator serving as a resonator located in the first stage on the demultiplexer-side terminal 32 side and a parallel arm resonator serving as a resonator located in the first stage on the antenna-side terminal 31 side is divided into a plurality of divided resonators, it is possible to more effectively reduce and prevent the occurrence of the Inter-Modulation Distortion (IMD) in the band elimination filter. In other words, the combined impedance of the divided resonators P11 and P12 is caused to be equal or substantially equal to the impedance of the parallel arm resonator P1 in the first preferred embodiment. Therefore, the number of pairs in each of the divided resonators P11 and P12 is twice as large as the number of pairs in the parallel arm resonator P1 in the first preferred embodiment. Therefore, the electrode area of the divided resonators P11 and P12 is larger than the electrode area of the parallel arm resonator P1 in the first preferred embodiment. Accordingly, the electric power consumption of the band elimination filter in the second example of a modification becomes smaller than in the first preferred embodiment. Accordingly, it is possible to more effectively reduce and prevent the occurrence of the Inter-Modulation Distortion (IMD).

In addition, by causing the apodization of each of the divided resonators P11 and P12 to be twice as large as the apodization of the parallel arm resonator P1 in the first preferred embodiment, the combined impedance of the divided resonators P11 and P12 may also be caused to be equal or substantially equal to the impedance of the parallel arm resonator P1 in the first preferred embodiment.

Third Example of Modification

Figure 11:
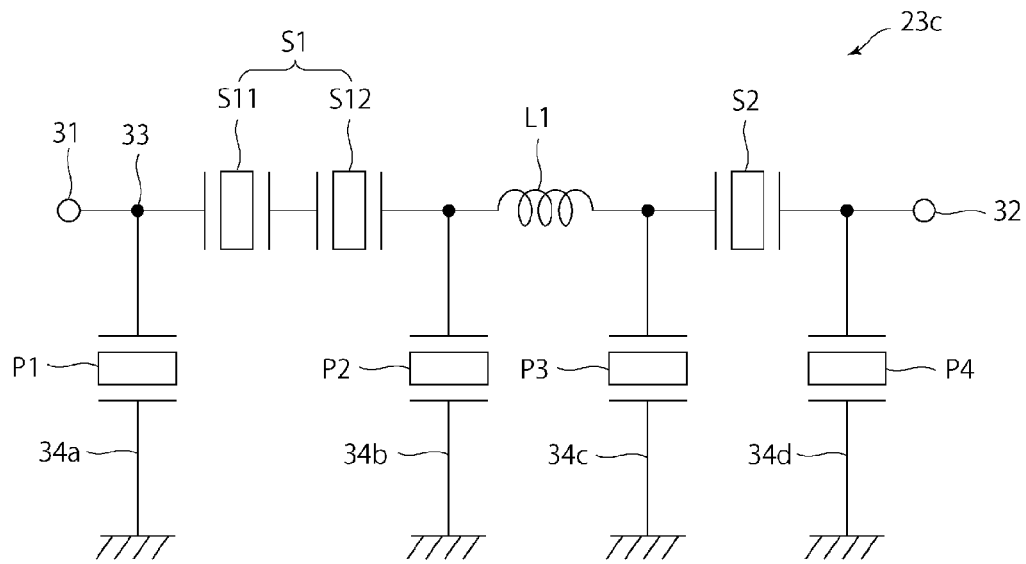
FIG. 11 is a schematic circuit diagram of a band elimination filter in a third example of a modification to the first preferred embodiment of the present invention.

FIG. 11 is the schematic circuit diagram of a band elimination filter 23c in a third example of a modification to the first preferred embodiment. As illustrated in FIG. 11, the band elimination filter 23c in the present example of a modification is different from the first example of a modification to the above-mentioned first preferred embodiment in that the series arm resonator S1 is divided into a plurality of divided resonators S11 and S12 functioning as one series arm resonator.

The combined impedance of the divided resonators S11 and S12 is caused to be equal or substantially equal to the impedance of the series arm resonator S1 in the first example of a modification. Therefore, the number of pairs in each of the divided resonators S11 and S12 is twice as large as the number of pairs in the series arm resonator S1 in the first example of a modification. Therefore, the electrode area of the divided resonators S11 and S12 is larger than the electrode area of the series arm resonator S1 in the first example of a modification.

Since, in this configuration, it is possible to widen the electrode area of the series arm resonator S1, the electric power consumption of the band elimination filter becomes small, and it is possible to more effectively reduce and prevent the occurrence of the Inter-Modulation Distortion (IMD) in the band elimination filter. In addition, by causing the apodization of each of the divided resonators S11 and S12 to be twice as large as the apodization of the series arm resonator S1 in the first example of a modification, the combined impedance of the divided resonators S11 and S12 may also be caused to be equal or substantially equal to the impedance of the series arm resonator S1 in the first example of a modification.

Fourth Example of Modification

Figure 12:
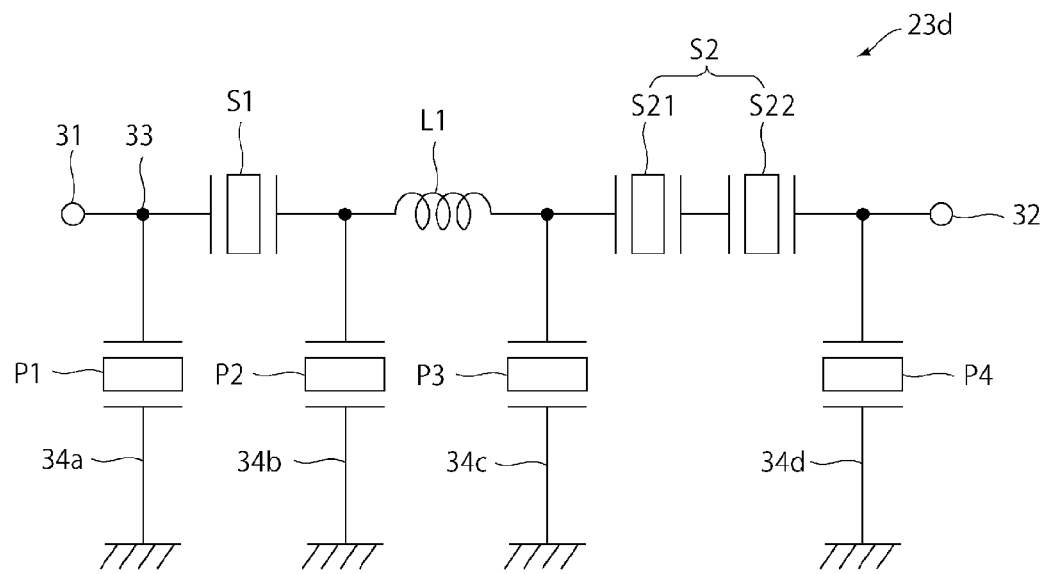
FIG. 12 is a schematic circuit diagram of a band elimination filter in a fourth example of a modification to the first preferred embodiment of the present invention.

FIG. 12 is the schematic circuit diagram of a band elimination filter 23d in a fourth example of a modification to the first preferred embodiment. As illustrated in FIG. 12, the band elimination filter 23d in the present example of a modification is different from the first example of a modification to the above-mentioned first preferred embodiment in that the series arm resonator S2 is divided into a plurality of divided resonators S21 and S22 functioning as one series arm resonator.

The combined impedance of the divided resonators S21 and S22 is caused to be equal or substantially equal to the impedance of the series arm resonator S2 in the first example of a modification. Therefore, the number of pairs in each of the divided resonators S21 and S22 is twice as large as the number of pairs in the series arm resonator S2 in the first example of a modification. Therefore, the electrode area of the divided resonators S21 and S22 is larger than the electrode area of the series arm resonator S2 in the first example of a modification.

Since, in this configuration, it is possible to widen the electrode area of the series arm resonator S2, the electric power consumption of the band elimination filter becomes small, and it is possible to more effectively reduce and prevent the occurrence of the Inter-Modulation Distortion (IMD) in the band elimination filter. In addition, by causing the apodization of each of the divided resonators S21 and S22 to be twice as large as the apodization of the series arm resonator S2 in the first example of a modification, the combined impedance of the divided resonators S21 and S22 may also be caused to be equal or substantially equivalent to the impedance of the series arm resonator S2 in the first example of a modification.

Fifth Example of Modification

Figure 13:
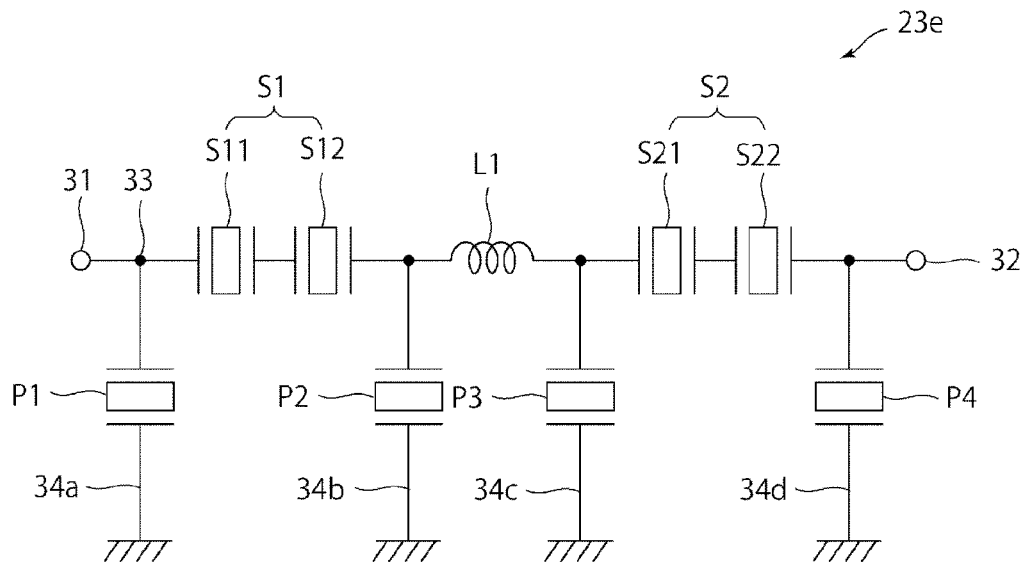
FIG. 13 is a schematic circuit diagram of a band elimination filter in a fifth example of a modification to the first preferred embodiment of the present invention.

FIG. 13 is the schematic circuit diagram of a band elimination filter 23$e$ in a fifth example of a modification to the first preferred embodiment. As illustrated in FIG. 13, the band elimination filter 23$e$ in the present example of a modification is different from the first example of a modification to the above-mentioned first preferred embodiment in that the series arm resonator S1 is divided into a plurality of divided resonators S11 and S12 functioning as one series arm resonator and the series arm resonator S2 is divided into a plurality of divided resonators S21 and S22 functioning as one series arm resonator.

The combined impedance of the divided resonators S11 and S12 is caused to be equal or substantially equal to the impedance of the series arm resonator S1 in the first example of a modification. Therefore, the number of pairs in each of the divided resonators S11 and S12 is twice as large as the number of pairs in the series arm resonator S1 in the first example of a modification. Therefore, the electrode area of the divided resonators S11 and S12 is larger than the electrode area of the series arm resonator S1 in the first example of a modification. The combined impedance of the divided resonators S21 and S22 is caused to be equal or substantially equal to the impedance of the series arm resonator S2 in the first example of a modification. Therefore, the number of pairs in each of the divided resonators S21 and S22 is twice as large as the number of pairs in the series arm resonator S2 in the first example of a modification. Therefore, the electrode area of the divided resonators S21 and S22 is larger than the electrode area of the series arm resonator S2 in the first example of a modification.

Since, in this configuration, it is possible to widen the electrode area of the series arm resonators S1 and S2, the electric power consumption of the band elimination filter becomes small, and it is possible to more effectively reduce and prevent the occurrence of the Inter-Modulation Distortion (IMD) in the band elimination filter. In addition, by causing the apodization of each of the divided resonators S11 and S12 to be twice as large as the apodization of the series arm resonator S1 in the first example of a modification, the combined impedance of the divided resonators S11 and S12 may also be caused to be equal or substantially equal to the impedance of the series arm resonator S1 in the first example of a modification. In addition, by causing the apodization of each of the divided resonators S21 and S22 to be twice as large as the apodization of the series arm resonator S2 in the first example of a modification, the combined impedance of the divided resonators S21 and S22 may also be caused to be equal or substantially equal to the impedance of the series arm resonator S2 in the first example of a modification.

Sixth Example of Modification

Figure 14:
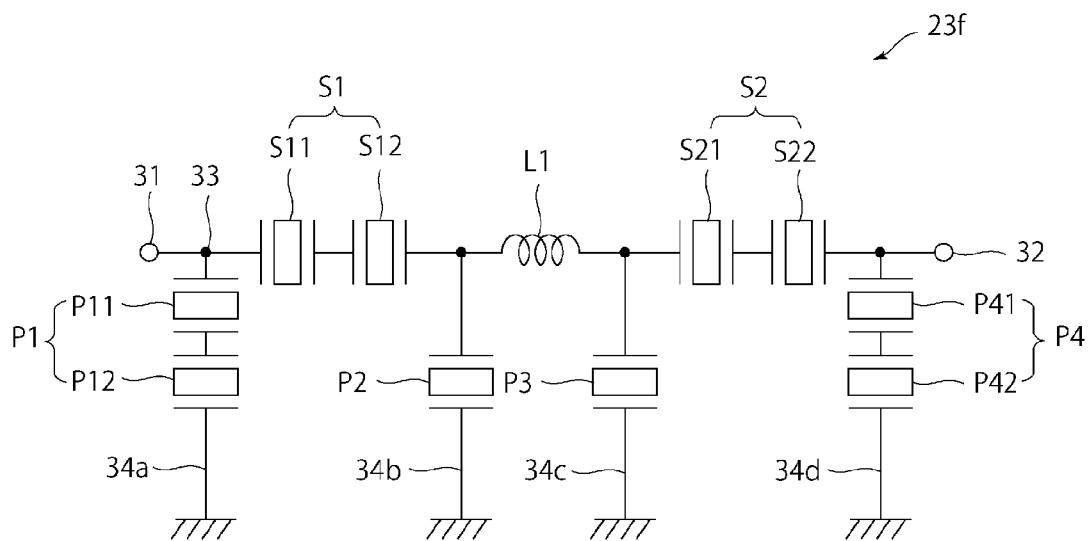
FIG. 14 is a schematic circuit diagram of a band elimination filter in a sixth example of a modification to the first preferred embodiment of the present invention.

FIG. 14 is the schematic circuit diagram of a band elimination filter 23$f$ in a sixth example of a modification to the first preferred embodiment. As illustrated in FIG. 14, the band elimination filter 23$f$ in the present example of a modification is different from the second example of a modification to the above-mentioned first preferred embodiment in that the series arm resonator S1 is divided into a plurality of divided resonators S11 and S12 functioning as one series arm resonator and the series arm resonator S2 is divided into a plurality of divided resonators S21 and S22 functioning as one series arm resonator.

The combined impedance of the divided resonators S11 and S12 is caused to be equal or substantially equal to the impedance of the series arm resonator S1 in the second example of a modification. Therefore, the number of pairs in each of the divided resonators S11 and S12 is twice as large as the number of pairs in the series arm resonator S1 in the second example of a modification. Therefore, the electrode area of the divided resonators S11 and S12 is larger than the electrode area of the series arm resonator S1 in the second example of a modification. The combined impedance of the divided resonators S21 and S22 is caused to be equal or substantially equal to the impedance of the series arm resonator S2 in the second example of a modification. Therefore, the number of pairs in each of the divided resonators S21 and S22 is twice as large as the number of pairs in the series arm resonator S2 in the second example of a modification. Therefore, the electrode area of the divided resonators S21 and S22 is larger than the electrode area of the series arm resonator S2 in the second example of a modification.

Since, in this configuration, it is possible to widen the electrode area of the series arm resonators S1 and S2, the electric power consumption of the band elimination filter becomes small, and it is possible to more effectively reduce and prevent the occurrence of the Inter-Modulation Distortion (IMD) in the band elimination filter. In addition, by causing the apodization of each of the divided resonators S11 and S12 to be twice as large as the apodization of the series arm resonator S1 in the second example of a modification, the combined impedance of the divided resonators S11 and S12 may also be caused to be equal or substantially equal to the impedance of the series arm resonator S1 in the second example of a modification. In addition, by causing the apodization of each of the divided resonators S21 and S22 to be twice as large as the apodization of the series arm resonator S2 in the second example of a modification, the combined impedance of the divided resonators S21 and S22 may also be caused to be equal or substantially equal to the impedance of the series arm resonator S2 in the second example of a modification.

Second Preferred Embodiment

Figure 15:
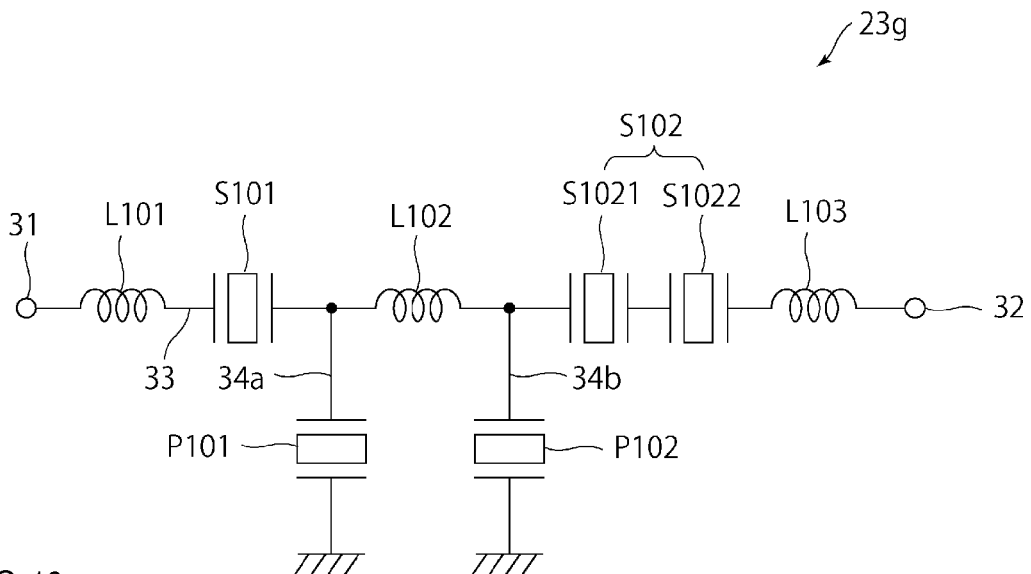
FIG. 15 is a schematic circuit diagram of a band elimination filter in a second preferred embodiment of the present invention.

FIG. 15 is the schematic circuit diagram of a band elimination filter 23$g$ in a second preferred embodiment of the present invention. A communication device in the present preferred embodiment has the same configuration as the above-mentioned first preferred embodiment, except that a high-frequency module includes the band elimination filter 23$g$ illustrated in FIG. 15, in place of the band elimination filter 23. Therefore, here, the band elimination filter 23$g$ will be described, and the description of the first preferred embodiment will be quoted with respect to the other configuration.

As illustrated in FIG. 15, the band elimination filter 23g is a filter including a plurality of resonators and an inductor, in the same way as the band elimination filter 23 in the first preferred embodiment. Specifically, the band elimination filter 23g is an elastic wave filter including a plurality of elastic wave resonators and an inductor.

In the same way as the band elimination filter 23 in the above-mentioned first preferred embodiment, the band elimination filter 23g includes the antenna-side terminal 31, the demultiplexer-side terminal 32, the series arm 33 connecting the antenna-side terminal 31 and the demultiplexer-side terminal 32 to each other, and the plural parallel arms 34a and 34b connecting the series arm 33 and the ground potential to each other. In the series arm 33, a plurality of series arm resonators S101 and S102 and inductors L101, L102, and L103 are provided. These plural series arm resonators S101 and S102 and the inductors L101, L102, and L103 are connected in series in the series arm 33. The inductor L101 is connected between the antenna-side terminal 31 and the series arm resonator S101. The inductor L102 is connected between the series arm resonator S101 and the series arm resonator S102. The inductor L103 is connected between the series arm resonator S102 and the demultiplexer-side terminal 32.

The series arm resonator S102 is divided into a plurality of divided resonators S1021 and S1022 functioning as one series arm resonator. By doing this, it is possible to reduce and prevent the occurrence of the Inter-Modulation Distortion (IMD) in the band elimination filter 23g, and it is possible to improve power durability.

The parallel arm 34a connects a portion between the series arm resonator S101 and the inductor L102 in the series arm 33 to the ground potential. In the parallel arm 34a, a parallel arm resonator P101 is provided. On the other hand, the parallel arm 34b connects a portion between the inductor L102 and the series arm resonator S102 in the series arm 33 to the ground potential. In the parallel arm 34b, a parallel arm resonator P102 is provided.

In the same way as the above-mentioned first preferred embodiment, each of the series arm resonators S101 and S102 and the parallel arm resonators P101 and P102 in the present preferred embodiment includes such a one-port type surface acoustic wave resonator as illustrated in FIG. 6. The inductors L101, L102, and L103 include chip-type inductors.

In the following Table 3, the design parameters of the series arm resonators S101 and S102 and the parallel arm resonators P101 and P102 in the present preferred embodiment are illustrated. In addition, since the divided resonators S1021 and S1022 function as one series arm resonator S102, same design parameters are adopted in the divided resonators S1021 and S1022. In addition, in the present preferred embodiment, the inductance value of the inductor L101 preferably is about 10 nH, for example. The inductance value of the inductor L102 preferably is about 10 nH, for example. The inductance value of the inductor L103 preferably is about 7.5 nH, for example.

Figure 16:
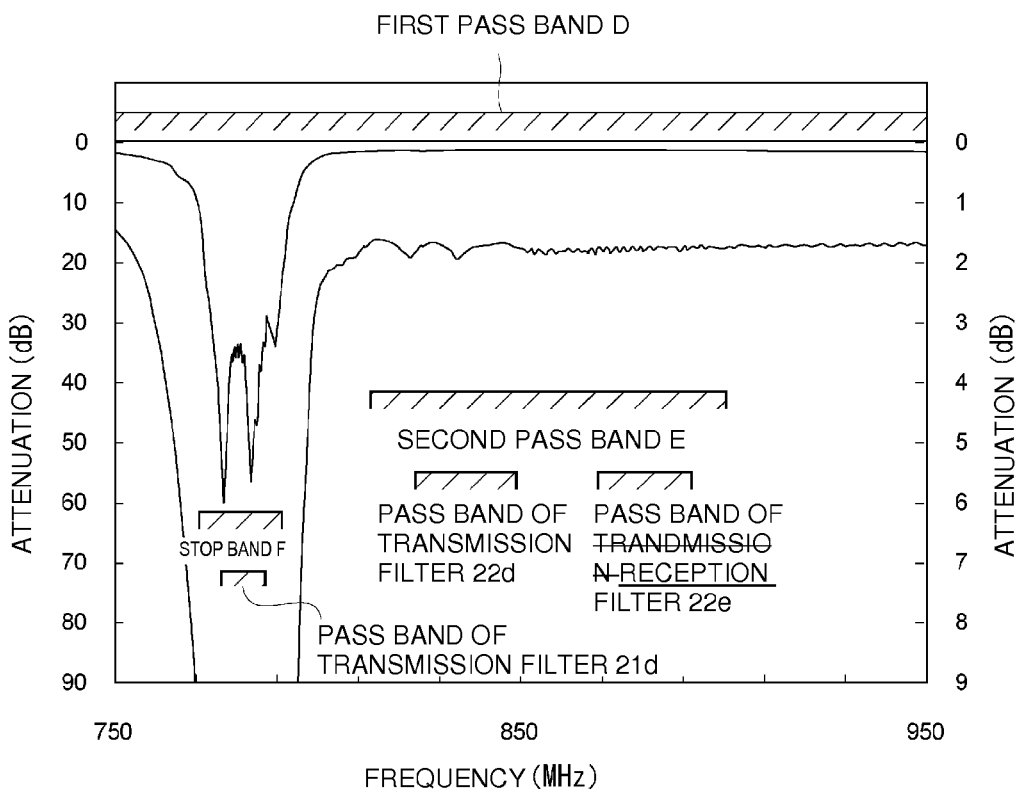
FIG. 16 is a graph illustrating a frequency characteristic of the band elimination filter in the second preferred embodiment of the present invention.

FIG. 16 is a graph illustrating the frequency characteristic of the band elimination filter 23g in the present preferred embodiment. As illustrated in FIG. 16, the band elimination filter 23g has a first pass band D, a second pass band E, and a stop band F. The second pass band E and the stop band F are located adjacent to each other within the first pass band D.

The first pass band D is formed by an LC resonance circuit due to the inductance of the inductors L101, L102, and L103, the capacitance of the series arm resonators S101 and S102, and the capacitance of the parallel arm resonators P101 and P102.

The second pass band E is allocated within the first pass band D, and adjacent to the stop band F. The second pass band E includes both of the pass band (824 MHz to 849 MHz) of the transmission filter 22d and the pass band (869 MHz to 894 MHz) of the reception filter 22e in the first duplexer 22 connected to the band elimination filter 23g.

The stop band F is allocated within the first pass band D, and adjacent to the second pass band E. The stop band F is formed by anti-resonance of the series arm resonators S101 and S102 and resonance of the parallel arm resonators P101 and P102. The stop band F includes the pass band (777 MHz to 787 MHz) of the transmission filter 21d in the second duplexer 21. In the present preferred embodiment, specifically, the stop band F roughly coincides with the pass band (777 MHz to 787 MHz) of the transmission filter 21d in the second duplexer 21.

Therefore, in the communication device of the present preferred embodiment where the high-frequency module including the band elimination filter 23g is mounted, the band elimination filter 23g causes the signal of the pass band of the reception filter 22e in the first duplexer 22 to pass therethrough, from among signals input to the antenna-side terminal 31, and causes the signal of the pass band of the transmission filter 22d in the first duplexer 22 to pass therethrough, from among signals input to the demultiplexer-side terminal 32. The band elimination filter 23g attenuates the signal of the pass band of the transmission filter 21d in the second duplexer 21 and prevents the signal from passing therethrough, from among signals input to the antenna-side terminal 31.

In the communication device of the present preferred embodiment, when the transmission of the audio communication and the transmission of the data communication are simultaneously performed, the transmission signal of the data communication of the UMTS-BAND13 is output from the second duplexer 21, and the transmission signal of the audio communication of the UMTS-BAND5 is output from the first duplexer 22. At this time, the transmission signal of the data communication of the UMTS-BAND13, which has flowed through the first antenna 11a and the second antenna 11b, is attenuated by the band elimination filter 23g. Accordingly, a portion of the transmission signal of the data communication of the UMTS-BAND13 hardly flows, as an interfering wave, into the reception filter 22e in the first duplexer 22. Accordingly, in the same way as the first preferred embodiment, in the present preferred embodiment, it is also possible to effec-

TABLE 3

|  | S101 | P101 | P102 | S1021 | S1022 |
|---|---|---|---|---|---|
| WAVELENGTH (μm) | 5.2235 | 4.9725 | 5.051 | 5.1373 | 5.1373 |
| APODIZATION (μm) | 120.4 | 45.0 | 45.0 | 137.7 | 137.7 |
| NUMBER OF PAIRS (PAIR) | 65 | 99 | 38 | 98 | 98 |
| DUTY RATIO | 0.75 | 0.69 | 0.69 | 0.75 | 0.75 |
| RESONANCE POINT (MHz) | 754 | 788 | 775 | 766 | 766 |
| ANTIRESONANCE POINT (MHz) | 777 | 814 | 800 | 790 | 790 | tively reduce and prevent the occurrence of the Inter-Modulation Distortion (IMD). As a result, it is possible to improve the receiving sensitivity of the communication device.

Hereinafter, an example of a modification to the above-mentioned second preferred embodiment will be described. In the following description, a member having a function substantially in common with the above-mentioned second preferred embodiment will be taken into consideration with a common symbol, and the description thereof will be omitted.

Seventh Example of Modification

Figure 17:
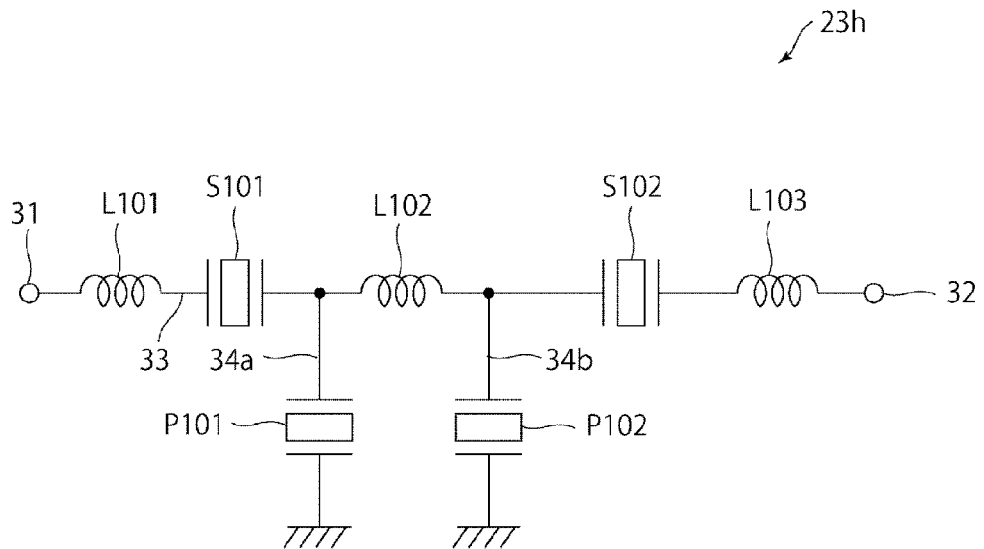
FIG. 17 is a schematic circuit diagram of a band elimination filter in one example of a modification (a seventh example of a modification) to the second preferred embodiment of the present invention.

FIG. 17 is the schematic circuit diagram of a band elimination filter 23h in a seventh example of a modification serving as one example of a modification to the second preferred embodiment.

As illustrated in FIG. 17, the band elimination filter 23h in the present example of a modification is different from the band elimination filter 23g in the second preferred embodiment in that the series arm resonator S102 is not divided into a plurality of divided resonators. In addition, the impedance of the series arm resonator S102 in the present example of a modification is caused to be equal or substantially equal to the combined impedance of the divided resonators S1021 and S1022 in the second preferred embodiment. In the present example of a modification, in the same way as in the second preferred embodiment, an advantageous effect in that it is possible to significantly reduce and prevent the occurrence of the Inter-Modulation Distortion (IMD) in the band elimination filter is also achieved. In addition, the series arm resonator S102 is not divided into a plurality of divided resonators, and hence, it is possible to downsize the band elimination filter 23h.

Eighth Example of Modification

Figure 18:
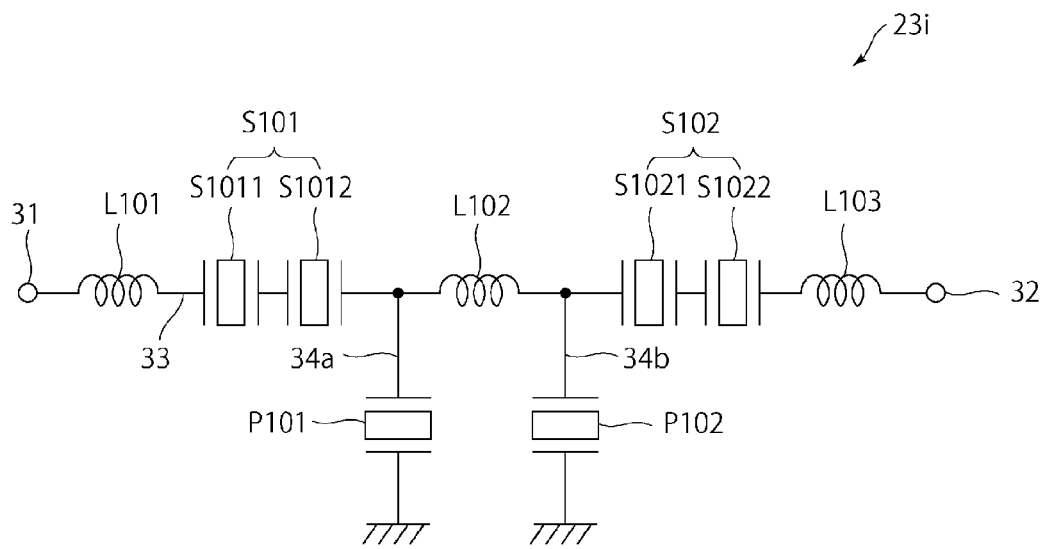
FIG. 18 is a schematic circuit diagram of a band elimination filter in one example of a modification (an eighth example of a modification) to the second preferred embodiment of the present invention.

FIG. 18 is the schematic circuit diagram of a band elimination filter 23i in an eighth example of a modification serving as one example of a modification to the second preferred embodiment.

As illustrated in FIG. 18, the band elimination filter 23i in the present example of a modification is different from the band elimination filter 23g in the second preferred embodiment in that the series arm resonator S101 is divided into a plurality of divided resonators S1011 and S1012 functioning as one series arm resonator.

In addition, the combined impedance of the divided resonators S1011 and S1012 in the present example of a modification is caused to be equal or substantially equal to the impedance of the series arm resonator S101 in the second preferred embodiment. Therefore, the number of pairs in each of the divided resonators S1011 and S1012 is twice as large as the number of pairs in the series arm resonator S101 in the second preferred embodiment. Therefore, the electrode area of the divided resonators S1011 and S1012 is larger than the electrode area of the series arm resonator S101 in the second preferred embodiment.

Since, in this configuration, it is possible to widen the electrode area of the series arm resonator S101, the electric power consumption of the band elimination filter becomes small, and it is possible to more effectively reduce and prevent the occurrence of the Inter-Modulation Distortion (IMD) in the band elimination filter. In addition, by causing the apodization of each of the divided resonators S1011 and S1012 to be twice as large as the apodization of the series arm resonator S101 in the second preferred embodiment, the combined impedance of the divided resonators S1011 and S1012 may also be caused to be equal or substantially equal to the impedance of the series arm resonator S101 in the second preferred embodiment.

Third Preferred Embodiment

Figure 19:
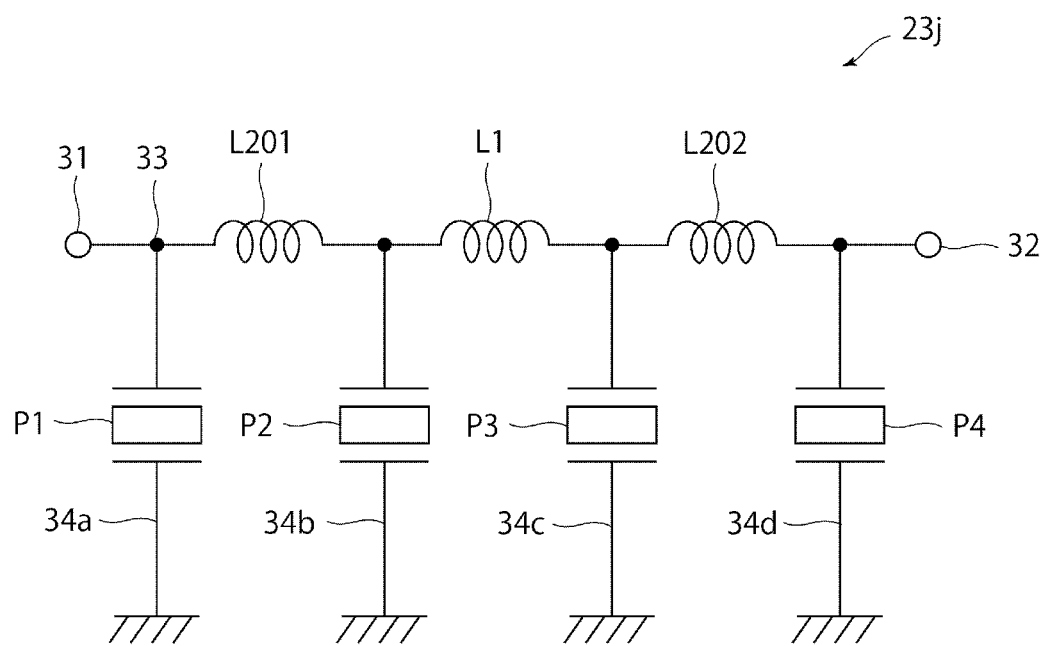
FIG. 19 is a schematic circuit diagram of a band elimination filter in a third preferred embodiment of the present invention.

FIG. 19 is the schematic circuit diagram of a band elimination filter 23j in a third preferred embodiment of the present invention. A communication device in the present preferred embodiment preferably has the same configuration as the first preferred embodiment, except that a high-frequency module includes the band elimination filter 23j illustrated in FIG. 19, in place of the band elimination filter 23. Therefore, here, the band elimination filter 23j will be described, and the description of the first preferred embodiment will be quoted with respect to the other configuration.

As illustrated in FIG. 19, the band elimination filter 23j is different from the band elimination filter 23a in the first example of a modification to the above-mentioned first preferred embodiment in that inductors L201 and L202 are disposed in place of the series arm resonators S1 and S2 in the band elimination filter 23a in the first example of a modification to the first preferred embodiment, illustrated in FIG. 9.

In the present preferred embodiment, in the same way as in the above-mentioned first preferred embodiment, it is also possible to effectively reduce and prevent the occurrence of the Inter-Modulation Distortion (IMD). As a result, it is possible to improve the receiving sensitivity of the communication device. Since the inductor has high linearity, it is possible to more effectively reduce and prevent the occurrence of the Inter-Modulation Distortion (IMD) in the band elimination filter, in the present preferred embodiment.

Another Example of Modification

In the above-mentioned first and second preferred embodiments, an example has been described where the band elimination filter preferably includes one-port type surface acoustic wave resonators. In this regard, however, the present invention is not limited to such a configuration. In the present invention, the band elimination filter may include, for example, a one-port type boundary acoustic wave resonator or a BAW (Bulk Acoustic Wave) resonator.

In addition, the band elimination filter may also include an LC resonance circuit including an inductor and a capacitor. Since the inductor and the capacitor have high linearity, it is possible to more effectively reduce and prevent the occurrence of the Inter-Modulation Distortion (IMD) in the band elimination filter. However, in the band elimination filter including the LC resonance circuit due to the inductor and the capacitor, it is difficult to obtain high steepness in a stop band. Accordingly, in a high-frequency module utilizing the band elimination filter including the LC resonance circuit including the inductor and the capacitor, when the transmission/reception bandwidths of two bands are adjacent to each other as in the transmission/reception bandwidth (824 MHz to 894 MHz) of the UMTS-BAND5 and the transmission/reception bandwidth (746 MHz to 787 MHz) of the UMTS-BAND13, it is difficult to form a desired stop band. In addition, in the band elimination filter including the LC resonance circuit including the inductor and the capacitor, a large number of inductors and capacitors are necessary to increase attenuation in the stop band, the band elimination filter, and thus the high-frequency module tends to grow in size. Therefore, it is desirable that the band elimination filter includes one of the one-port type surface acoustic wave resonator, the one-port type boundary acoustic wave resonator, and the BAW (Bulk Acoustic Wave) resonator capable of forming a stop band whose steepness is high and whose attenuation is large and capable of being also downsized. Specifically, it is desirable that the band elimination filter includes one of the one-port type surface acoustic wave resonator, the one-port type boundary acoustic wave resonator, and the BAW (Bulk Acoustic Wave) resonator and at least one inductor.

In the first and second preferred embodiments, an example has been described where the communication device preferably includes two antennae, namely the first and second antennae 11a and 11b, the second duplexer 21 in the high-frequency module is preferably connected to the first antenna 11a, and the first duplexer 22 is preferably connected to the second antenna 11b through the band elimination filter 23. In this regard, however, the present invention is not limited to such a configuration.

The communication device may include one antenna, the second duplexer 21 may be connected to the corresponding antenna, and the first duplexer 22 may also be connected to the corresponding antenna through the band elimination filter. When the communication device includes one antenna, a portion of the transmission signal output from the second duplexer 21 easily flows, as an interfering wave, into the reception filter 22e in the first duplexer 22. Therefore, the advantageous effect of the present invention that the band elimination filter effectively reduces and prevents the occurrence of the Inter-Modulation Distortion (IMD) in the first duplexer 22 becomes larger.

In the first and second preferred embodiments, an example has been described where the second duplexer 21 preferably is a demultiplexer compatible with the UMTS-BAND13 and the first duplexer 22 preferably is a demultiplexer compatible with the UMTS-BAND5, for example. In this regard, however, the present invention is not limited to such a configuration. When it is assumed that, from among a plurality of demultiplexers configuring the communication device, the frequency of the transmission signal of a demultiplexer connected to the band elimination filter is Tx1, the frequency of the reception signal thereof is Rx1, and the frequency of the transmission signal of a demultiplexer not connected to the band elimination filter is Tx2, it is only necessary for the first and second duplexers 22 and 21 to be compatible with a BAND satisfying the following Relational Expression (1).

$$2Tx1 - Tx2 = Rx1 \quad (1)$$

Specifically, for example, the second duplexer 21 may also be a demultiplexer compatible with the UMTS-BAND5, and the first duplexer 22 may also be a demultiplexer compatible with a UMTS-BAND8. In addition, for example, the second duplexer 21 may also be a demultiplexer compatible with a UMTS-BAND1, and the first duplexer 22 may also be a demultiplexer compatible with a UMTS-BAND10.

In the first and second preferred embodiments, an example has been described where the transmission filter 21d and the reception filter 21e in the second duplexer 21 and the transmission filter 22d and the reception filter 22e in the first duplexer 22 preferably are surface acoustic wave filters. In this regard, however, the present invention is not limited to such a configuration. The transmission filter 21d and the reception filter 21e in the second duplexer 21 and the transmission filter 22d and the reception filter 22e in the first duplexer 22 may also be, for example, boundary acoustic wave filters or BAW filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   first and second demultiplexers each of which includes a common terminal, a transmission filter, and a reception filter, the transmission filter and the reception filter of the first and second demultiplexers are connected to the common terminal; and
   a band elimination filter that includes an antenna-side terminal and a demultiplexer-side terminal, the demultiplexer-side terminal is connected to the common terminal of the first demultiplexer; wherein
   the band elimination filter includes a first pass band, and a second pass band and a stop band that are located adjacent to each other within the first pass band; and
   the band elimination filter is configured so that the second pass band includes a pass band of each of the transmission filter and the reception filter in the first demultiplexer and the stop band includes a pass band of the transmission filter in the second demultiplexer.

2. The high-frequency module according to claim 1, wherein the band elimination filter is configured so that the stop band coincides or substantially coincides within the pass band of the transmission filter in the second demultiplexer.

3. The high-frequency module according to claim 1, wherein the band elimination filter includes a plurality of resonators and an inductor.

4. The high-frequency module according to claim 3, wherein
   the band elimination filter includes a series arm and a plurality of parallel arms;
   at least some resonators from among the plurality of resonators are parallel arm resonators in the plurality of parallel arms; and
   at least one of a resonator of the plurality of resonators is located in a first stage on the antenna-side terminal side of the band elimination filter and a resonator of the plurality of resonators is located in a first stage on the demultiplexer-side terminal side thereof is a parallel arm resonator.

5. The high-frequency module according to claim 3, wherein
   the band elimination filter includes a series arm and a plurality of parallel arms;
   the plurality of resonators are connected to at least one of the series arm and the plurality of parallel arms; and
   at least one of a resonator of the plurality of resonators is located in a first stage on the antenna-side terminal side of the band elimination filter and a resonator of the plurality of resonators is located in a first stage on the demultiplexer-side terminal side thereof is divided into a plurality of divided resonators and connected in series.

6. The high-frequency module according to claim 3, wherein
   the band elimination filter includes a series arm and a plurality of parallel arms; and
   the series arm includes the plurality of resonators and the inductor.

7. The high-frequency module according to claim 6, wherein at least one of the plurality of series arm resonators is divided into a plurality of divided resonators.

8. The high-frequency module according to claim 1, wherein the band elimination filter includes a series arm resonator that is divided into a plurality of divided resonators.

9. The high-frequency module according to claim 1, wherein the band elimination filter includes at least two series arm resonators, and each of the at least two series arm resonators is divided into a plurality of divided resonators.

10. The high-frequency module according to claim 1, wherein the band elimination filter is an elastic wave filter including a plurality of elastic wave resonators and an inductor.

11. The high-frequency module according to claim 1, wherein the band elimination filter includes a one-port surface acoustic wave resonator.

12. The high-frequency module according to claim 1, wherein the band elimination filter includes a parallel arm resonator that is divided into a plurality of divided resonators.

13. The high-frequency module according to claim 1, wherein
the band elimination filter includes a series arm and a plurality of parallel arms; and
the series arm includes a plurality of inductors.

14. The high-frequency module according to claim 1, wherein the band elimination filter includes a one-port boundary acoustic wave resonator.

15. The high-frequency module according to claim 1, wherein the band elimination filter includes a one-port bulk acoustic wave resonator.

16. The high-frequency module according to claim 1, wherein the band elimination filter includes an LC resonance circuit including an inductor and a capacitor.

17. The high-frequency module according to claim 1, wherein each of the transmission filter and the reception filter of the first and second demultiplexers is a surface acoustic filter, a boundary acoustic wave filter or a bulk acoustic wave filter.

18. A communication device comprising the high-frequency module according to claim 1.

19. The communication device according to claim 18, wherein the communication device uses a UMTS-BAND5 or UMTS-BAND8 for audio communication and a UMTS-BAND13, UMTS-BAND1 or UMTS-BAND10 for data communication.

20. The communication device according to claim 18, further comprising a single antenna or at least two antennae.

* * * * *